United States Patent
Wang et al.

(10) Patent No.: US 12,394,676 B2
(45) Date of Patent: Aug. 19, 2025

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Chen-Chao Wang, Kaohsiung (TW); Chih-Yi Huang, Kaohsiung (TW); Keng-Tuan Chang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/439,743

(22) Filed: Feb. 12, 2024

(65) Prior Publication Data

US 2024/0186193 A1 Jun. 6, 2024

Related U.S. Application Data

(63) Continuation of application No. 17/893,033, filed on Aug. 22, 2022, now Pat. No. 11,901,245, which is a
(Continued)

(51) Int. Cl.
*H01L 21/66* (2006.01)
*H01L 23/485* (2006.01)
(Continued)

(52) U.S. Cl.
CPC ............ *H01L 22/22* (2013.01); *H01L 23/485* (2013.01); *H01L 23/49838* (2013.01); *H01L 25/0655* (2013.01); *H01L 25/50* (2013.01)

(58) Field of Classification Search
CPC .............................. H01L 22/22; H01L 23/485
See application file for complete search history.

(56) References Cited

U.S. PATENT DOCUMENTS

| 8,656,333 B1 | 2/2014 | Bishop et al. |
| 8,799,845 B2 | 8/2014 | Scanlan et al. |

(Continued)

OTHER PUBLICATIONS

Notice of Allowance for U.S. Appl. No. 17/067,565, Issued Apr. 20, 2022, 8 pages.
(Continued)

*Primary Examiner* — Thao P Le
(74) *Attorney, Agent, or Firm* — FOLEY & LARDNER LLP

(57) ABSTRACT

A semiconductor package structure and a method for manufacturing the same are provided. The method includes: providing a package body includes a first semiconductor device, wherein the first semiconductor device includes a plurality of first electrical contacts disposed adjacent to an active surface of the first semiconductor device; measuring the actual positions of the first electrical contacts of the first semiconductor device; providing a plurality of second electrical contacts outside the first semiconductor device; and forming an interconnection structure based on the actual positions of the first electrical contacts of the first semiconductor device and the positions of the second electrical contacts satisfying a predetermined electrical performance criterion by a mask-less process, so as to connect the first electrical contacts and the second electrical contacts and maintain signal integrity during transmission.

10 Claims, 21 Drawing Sheets

Related U.S. Application Data continuation of application No. 17/067,565, filed on Oct. 9, 2020, now Pat. No. 11,424,167.

(51) Int. Cl.
*H01L 23/498* (2006.01)
*H01L 25/00* (2006.01)
*H01L 25/065* (2023.01)

(56) References Cited

U.S. PATENT DOCUMENTS

| | | |
|---|---|---|
| 8,826,221 B2 | 9/2014 | Scanlan et al. |
| 9,196,509 B2 | 11/2015 | Scanlan et al. |
| 9,418,905 B2 | 8/2016 | Olson et al. |
| 9,520,331 B2 | 12/2016 | Scanlan et al. |
| 9,887,103 B2 | 2/2018 | Scanlan et al. |
| 11,901,245 B2 * | 2/2024 | Wang ............... H01L 23/485 |
| 2017/0125375 A1 * | 5/2017 | Chinnusamy ........ H01L 21/486 |
| 2019/0043834 A1 | 2/2019 | Kim |
| 2019/0326255 A1 * | 10/2019 | Olson ............... H01L 21/78 |
| 2020/0235018 A1 | 7/2020 | Kim et al. |
| 2020/0335408 A1 | 10/2020 | Gao et al. |
| 2022/0057444 A1 | 2/2022 | Kim et al. |
| 2022/0302043 A1 * | 9/2022 | Lee ............... H01L 21/565 |
| 2022/0310500 A1 * | 9/2022 | Chang ............. H01L 23/49838 |
| 2023/0085890 A1 | 3/2023 | Dabral et al. |
| 2023/0253302 A1 * | 8/2023 | Lee ............... H01L 25/16 |
| | | 257/773 |
| 2023/0268293 A1 * | 8/2023 | Lee ............... H01L 23/645 |
| | | 257/528 |
| 2023/0280372 A1 | 9/2023 | Blin et al. |
| 2023/0411303 A1 * | 12/2023 | Shin ............... H01L 21/4853 |
| 2024/0404878 A1 * | 12/2024 | O'Toole ............ H01L 23/528 |

OTHER PUBLICATIONS

Notice of Allowance for U.S. Appl. No. 17/893,033, issued Oct. 5, 2023, 9 pages.

* cited by examiner

SEMICONDUCTOR PACKAGE STRUCTURE AND METHOD FOR MANUFACTURING THE SAME

CROSS-REFERENCE TO RELATED APPLICATION

This application is a continuation of U.S. patent application Ser. No. 17/893,033, filed Aug. 22, 2022, now U.S. Pat. No. 11,901,245, which is a continuation of U.S. patent application Ser. No. 17/067,565 filed Oct. 9, 2020, now issued as U.S. Pat. No. 11,424,167, the contents of which are incorporated herein by reference in their entirety.

BACKGROUND

1. Field of the Disclosure

The present disclosure relates to a semiconductor package structure and a manufacturing method, and to a semiconductor package structure including an interconnection structure, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. In manufacturing the semiconductor package structure that includes semiconductor chips with an increased number of I/O connections, the semiconductor chips may shift or rotate during the pick-and-place process and/or the molding process. Shifting or rotating may limit the effective areas of the pads of the semiconductor chips, thus, making it more difficult to form an interconnection structure that can electrically connect the semiconductor chips and achieve a desired overall electrical performance. In a worst case, some of the semiconductor package structures may be defective after singulation due to the shifting and/or rotating. Thus, a yield of the semiconductor package structures may decrease.

SUMMARY

In some embodiments, a method for manufacturing a semiconductor package structure includes: providing a package body includes a first semiconductor device, the first semiconductor device including a plurality of first electrical contacts disposed adjacent to an active surface of the first semiconductor device; measuring the actual positions of the first electrical contacts of the first semiconductor device; providing a plurality of second electrical contacts outside the first semiconductor device; and forming an interconnection structure based on the actual positions of the first electrical contacts of the first semiconductor device and the positions of the second electrical contacts satisfying a predetermined electrical performance criterion by a mask-less process, so as to connect the first electrical contacts and the second electrical contacts and maintain signal integrity during transmission.

In some embodiments, a semiconductor package structure includes a first semiconductor device, a plurality of first electrical contacts, a plurality of second electrical contacts and an interconnection structure. The first electrical contacts are disposed adjacent to an active surface of the first semiconductor device. A first imaginary line extends through a row of the first electrical contacts. The second electrical contacts are spaced apart from the first semiconductor device. A second imaginary line extends through a row of the second electrical contacts. An intersection angle is formed between the first imaginary line and the second imaginary line. The intersection angle is greater than 0.3 degrees. An interconnection structure connects the first electrical contacts and the second electrical contacts.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
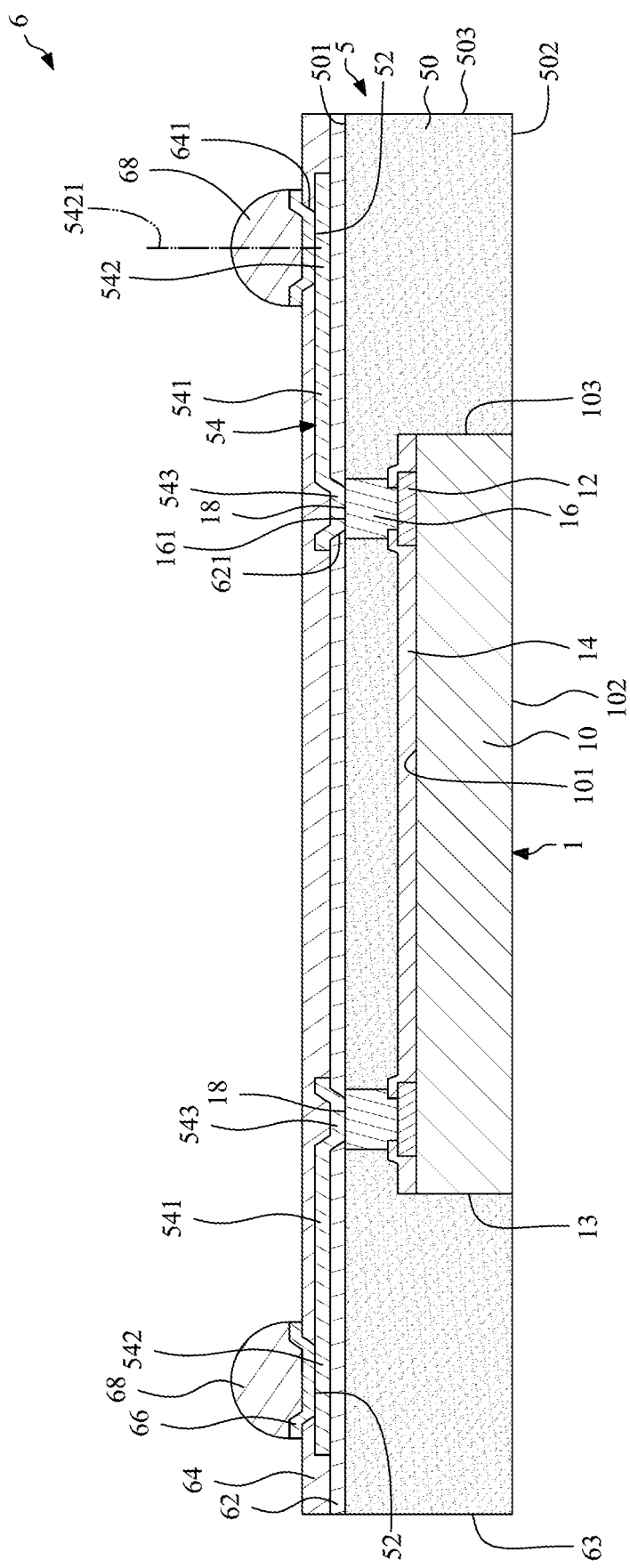
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
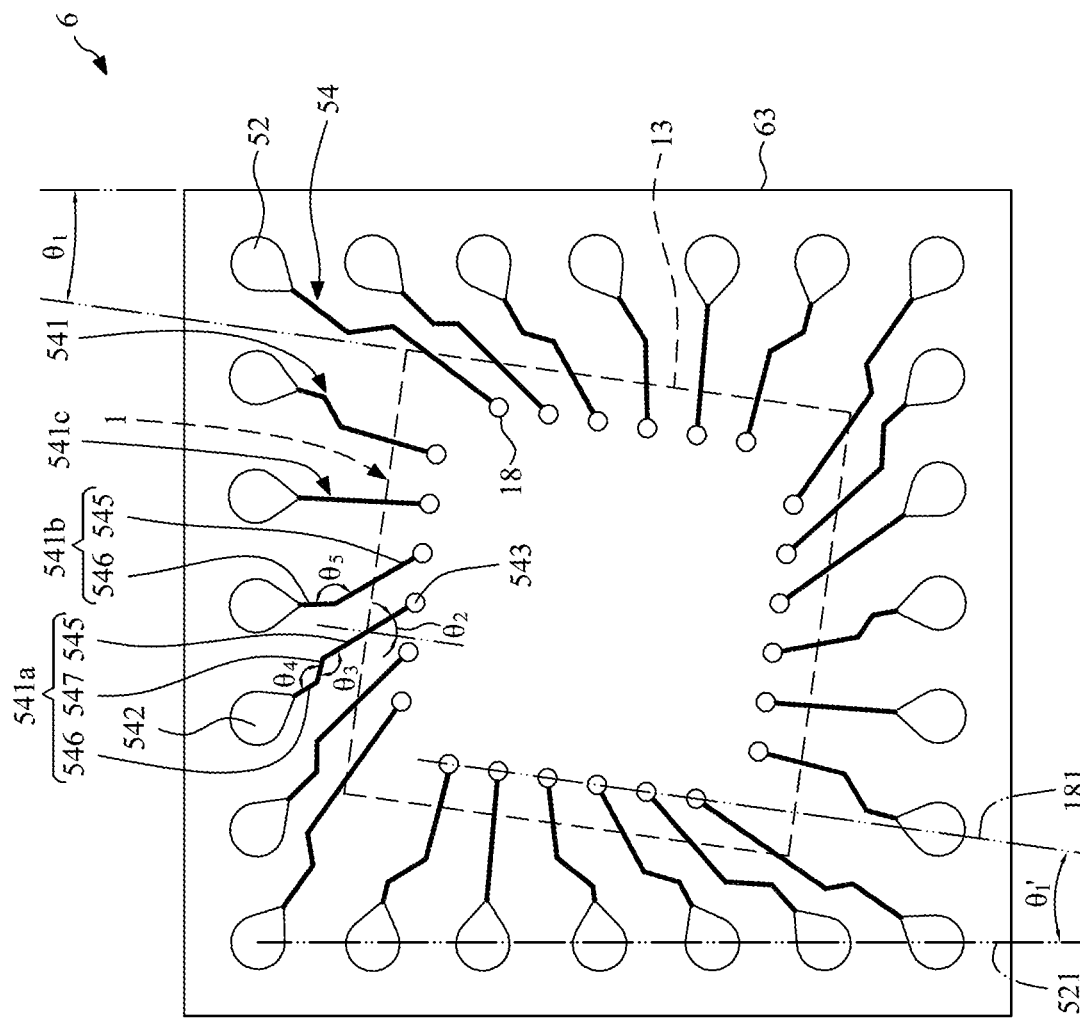
FIG. 2 illustrates a schematic top view of the semiconductor package structure of FIG. 1, with the second dielectric layer, the under bump metallurgies (UBMs), and the external connectors being omitted, according to some embodiments of the present disclosure.

FIG. 1 illustrates a cross-sectional view of a semiconductor package structure 6 according to some embodiments of the present disclosure. FIG. 2 illustrates a schematic top view of the semiconductor package structure 6 of FIG. 1, with the second dielectric layer 64, the UBMs 66 and the external connectors 68 being omitted. The semiconductor package structure 6 may include a package body 5, a first dielectric layer 62, an interconnection structure 54, a second dielectric layer 64, a plurality of UBMs 66, and a plurality of external connectors 68.

The package body 5 may include a first semiconductor device 1 and an encapsulant 50. The first semiconductor device 1 (e.g., a semiconductor die) may include a base material 10, a plurality of die pads 12, a passivation layer 14, and a plurality of interconnectors 16. The base material 10 may include silicon, and may have a first surface 101 (e.g., an active surface), a second surface 102 (e.g., a backside surface) opposite to the first surface 101, and a lateral side surface 103 extending between the first surface 101 and the second surface 102. In some embodiments, the second surface 102 and the lateral side surface 103 of the base material 10 may be a bottom surface and a lateral side surface of the first semiconductor device 1, respectively. The die pads 12 may include copper, aluminum, or gold, and may be disposed adjacent to the first surface 101 of the base material 10. The passivation layer 14 may cover the first surface 101 of the base material 10 and periphery portions of the die pads 12, and may define a plurality of openings to expose central portions of the die pads 12. The interconnectors 16 may be bumps, studs, or pillars, and may be disposed in the openings of the passivation layer 14 and contact the die pads 12. In some embodiments, the interconnectors 16 may include conductive metal such as copper. Each of the interconnectors 16 may have a first surface 161 (e.g., a top surface).

The encapsulant 50 (e.g., a molding compound with or without fillers) may cover the first semiconductor device 1. For example, the encapsulant 50 may cover the passivation layer 14, the interconnectors 16, and the lateral side surface 103 of the base material 10. The encapsulant 50 may have a first surface 501 (e.g., a top surface), a second surface 502 (e.g., a bottom surface) opposite to the first surface 501, and a lateral side surface 503 extending between the first surface 501 and the second surface 502. The second surface 502 (e.g., the bottom surface) of the encapsulant 50 may be substantially coplanar with the second surface 102 of the base material 10 of the first semiconductor device 1. Further, the first surface 501 (e.g., the top surface) of the encapsulant 50 may be substantially coplanar with the first surface 161 (e.g., the top surface) of the interconnector 16. Thus, the first surfaces 161 of the interconnectors 16 may be exposed from the first surface 501 of the encapsulant 50, and may be defined as a plurality of first electrical contacts 18 that are disposed adjacent to the first surface 101 (e.g., the active surface) of the first semiconductor device 1. In some embodiments, the interconnectors 16 may be omitted, and the die pads 12 may be exposed from the first surface 501 of the encapsulant 50, and may be defined as the first electrical contacts 18.

The first dielectric layer 62 may be disposed on and cover the encapsulant 50 (e.g., a surface thereof), and may define a plurality of openings 621 to expose the first surfaces 161 of the interconnectors 16. Thus, the openings 621 of the first dielectric layer 62 may be disposed right above the first surfaces 161 of the interconnectors 16. That is, the openings 621 of the first dielectric layer 62 may be aligned with at least a portion of the interconnectors 16. In some embodiments, the first dielectric layer 62 may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof.

The interconnection structure 54 may be formed on a top surface of the first dielectric layer 62 and in the openings 621 of the first dielectric layer 62. The interconnection structure 54 may be a fan-out redistribution layer. For example, the interconnection structure 54 may include a plurality of conductive traces 541 and a plurality of conductive pads 542, 543. The conductive pads 543 may be disposed in the openings 621 of the first dielectric layer 62 and contact the first surfaces 161 of the interconnectors 16. The conductive pads 542 may be disposed right under the UBMs 66 and may be also referred to as "capture lands". The conductive traces 541 extend between the conductive pads 542, 543. One end of the conductive trace 541 connects to the conductive pad 542, and the other end of the conductive trace 541 connects to the conductive pad 543. In some embodiments, the conductive traces 541 and the conductive pads 542, 543 may be formed integrally and concurrently. The conductive trace 541 may be a monolithic trace extending from one conductive pad 542 to another conductive pad 543. Although the interconnection structure 54 may include one circuit layer as shown in FIG. 1, in other embodiments, the interconnection structure 54 may include a plurality of circuit layers electrically connected to one another.

The second dielectric layer 64 may cover the first dielectric layer 62 and the interconnection structure 54, and may define a plurality of openings 641 to expose the conductive pads 542 (e.g., the capture lands) of the interconnection structure 54. Thus, the openings 641 of the second dielectric layer 64 may be disposed right above the conductive pads 542 (e.g., the capture lands) of the interconnection structure 54 in some embodiments. Alternatively, the conductive pads 542 (e.g., the capture lands) of the interconnection structure 54 may be disposed right under the openings 641 of the second dielectric layer 64. That is, the center of the opening 641 of the second dielectric layer 64 may be substantially aligned with the center of the conductive pad 542 (e.g., the capture lands) of the interconnection structure 54. Alternatively, the center of the opening 641 of the second dielectric layer 64 may be substantially disposed at the central axis 5421 of the conductive pad 542 (e.g., the capture lands) of the interconnection structure 54. In some embodiments, the second dielectric layer 64 may include, or be formed from, a photoresist layer, a cured photosensitive material, a cured PID material such as a PA, an ABF, a BT, a PI, epoxy or PBO, or a combination of two or more thereof.

The UBMs 66 may be formed on a top surface of the second dielectric layer 64 and in the openings 641 of the second dielectric layer 64 so as to contact the conductive pads 542 (e.g., the capture lands) of the interconnection structure 54. As shown in FIG. 1, the bottom surface of the UBM 66 may contact the conductive pad 542 (e.g., the capture lands), and may be defined as a plurality of second electrical contacts 52. That is, the UBMs 66 may be disposed at the positions of the second electrical contacts 52, and may contact the interconnection structure 54. The second electrical contacts 52 are spaced apart from the first electrical contacts 18. In some embodiments, the second electrical contacts 52 may be disposed over the encapsulant 50, and outside a projection area of the first semiconductor device 1.

The external connectors 68 (e.g., solder balls) may be formed or disposed on the UBMs 66.

As shown in FIG. 2, the first semiconductor device 1 may have a periphery side surface 13 which may be the lateral side surface 103 of the base material 10. The semiconductor package structure 6 may have a periphery side surface 63 which may be the lateral side surface 503 of the encapsulant 50. The periphery side surface 13 of the first semiconductor device 1 may be misaligned with the periphery side surface 63 of the semiconductor package structure 6. That is, the periphery side surface 13 of the first semiconductor device 1 (or the lateral side surface 103 of the base material 10) may not be parallel with the periphery side surface 63 of the semiconductor package structure 6 (or the lateral side surface 503 of the encapsulant 50). An intersection angle $\theta_1$ may be formed between the extension of the periphery side surface 13 of the first semiconductor device 1 and the extension of the periphery side surface 63 of the semiconductor package structure 6. In some embodiments, the intersection angle $\theta_1$ may be greater than zero degree and less than 45 degrees. The formation of the intersection angle $\theta_1$ is due to the rotation of the first semiconductor device 1 during a molding process by applying the encapsulant 50.

In addition, the first electrical contacts 18 may be arranged to be at least one row, and a first imaginary line 181 may extend through a row (e.g., an outermost row) of the first electrical contacts 18. The first imaginary line 181 may extend through the centers of the first electrical contacts 18 in such row. Further, the second electrical contacts 52 may be arranged to be at least one row, and a second imaginary line 521 may extend through a row (e.g., an outermost row) of the second electrical contacts 52. The second imaginary line 521 may extend through the centers of the second electrical contacts 52 in such row. An intersection angle $\theta_{1'}$ is formed between the first imaginary line 181 and the second imaginary line 521, and the intersection angle $\theta_{1'}$ is greater than about 0.3 degrees, or about 0.6 degrees. That is, the row of the first electrical contacts 18 may not be parallel with the row of the second electrical contacts 52.

As shown in FIG. 2, the conductive traces 541 may include at least one trace 541a, at least one trace 541b and at least one trace 541c. The trace 541a may include at least one first segment 545, at least one second segment 546 and at least one third segment 547. The first segment 545 is directly connected to the first electrical contact 18 (or the conductive pad 543), and an intersection angle $\theta_2$ is formed between the first segment 545 and a normal direction of the periphery side surface 13 of the first semiconductor device 1. The intersection angle $\theta_2$ may be greater than or equal to 0.5 degree and less than or equal to 45 degrees. That is, the first segment 545 may not be perpendicular to the periphery side surface 13 of the first semiconductor device 1. The second segment 546 is connected to the second electrical contact 52 (or the conductive pad 542), and may be substantially parallel with the first segment 545. The third segment 547 intersects with the first segment 545 at an intersection angle $\theta_3$, and the third segment 547 intersects with the second segment 546 at an intersection angle $\theta_4$. The intersection angle $\theta_3$ may be substantially equal to the intersection angle $\theta_4$. For example, both of the intersection angle $\theta_3$ and the intersection angle $\theta_4$ may be about 135 degrees.

The trace 541b may include at least one first segment 545 and at least one second segment 546. The first segment 545 intersects with the second segment 546 at an intersection angle $\theta_5$ which may be about 135 degrees. The trace 541c may be a substantially straight line. As shown in FIG. 2, the trace 541a has two turning points, the trace 541b has one turning point, and the trace 541c has no turning point. Thus, the count of turning point(s) of one of the conductive traces 541 is less than or equal to six.

As shown in the embodiment illustrated in FIG. 1 and FIG. 2, the interconnection structure 54 is used for directly connecting the first electrical contacts 18 (or the conductive pads 543) and the second electrical contacts 52 (or the conductive pads 542). In some embodiments, the positions of the second electrical contacts 52 (or the positions of the openings 641 of the second dielectric layer 64 or the positions of the UBMs 66) may be fixed. However, the first semiconductor device 1 may shift or rotate during a pick-and-place process and/or a molding process. As shown in FIG. 2, the dashed lines may represent the initial position (or the predetermined position) of the first semiconductor device 1 before molding process, and the solid lines may represent the actual position of the first semiconductor device 1 after the molding process. That is, after the pick-and-place process and the molding process, the first electrical contacts 18 of the first semiconductor device 1 may move from the initial positions to the actual positions. If the interconnection structure 54 is formed according to a simulated interconnection structure based on the initial positions of the first electrical contacts 18 of the first semiconductor device 1 and the fixed positions of the second electrical contacts 52, the interconnection structure 54 will not physically connect the first electrical contacts 18 and the second electrical contacts 52 accurately, which reduces the yield rate of the semiconductor package structure 6. To address such concerns, in the present disclosure, the whole interconnection structure 54 is formed according to a simulated interconnection structure based on the actual positions of the first electrical contacts 18 of the first semiconductor device 1 and the predetermined positions of the second electrical contacts 52 under at least one requirement satisfying a predetermined electrical performance threshold. Thus, the whole interconnection structure 54 satisfies the predetermined electrical performance threshold. The predetermined electrical performance threshold/criterion may correspond to a data loss or a data loss rate of the signals transmitted in the conductive traces 541 of the interconnection structure 54. For example, the data loss rate may be less than 10%, 5%, or 3%. As a result, the signal integrity during transmission may be maintained, and the signals transmitted in the conductive traces 541 of the interconnection structure 54 are not reduced or increased. Thus, the electrical performance and the yield rate of the semiconductor package structure 6 may be improved.

In some embodiments, the requirement satisfying a predetermined electrical performance criterion may be achieved by the design rules such as but not limited to, values of one or more of the following parameters meeting a predetermined threshold: a line width/line space (L/S) of the conductive traces 541, a length of the conductive trace 541, a consistency of a width of the conductive trace 541, a size of the conductive pads 542, 543, a space between the conductive pads 542, 543 and an adjacent conductive trace 541, a ratio of an actual length of the conductive trace 541 to a distance between the first electrical contacts 18 and the second electrical contacts 52, a size of the opening 621 of the first dielectric layer 62, a space between the openings 621 of the first dielectric layer 62, a count of turning point of one conductive trace 541, a consistency of a gap (or space) between two adjacent conductive traces 541, or a count of stacked vias. For example, the line width and space of the conductive traces 541 being equal to or greater than 10 μm and 3 μm, respectively satisfies the design rule and meets the manufacturing requirement. In some embodiments, the at least one design rule may include a plurality of first design rules and a plurality of second design rules. A value of each of the first design rules may be specific, and a value of each of the second design rules may be in a range and may be adjustable.

Figure 3:
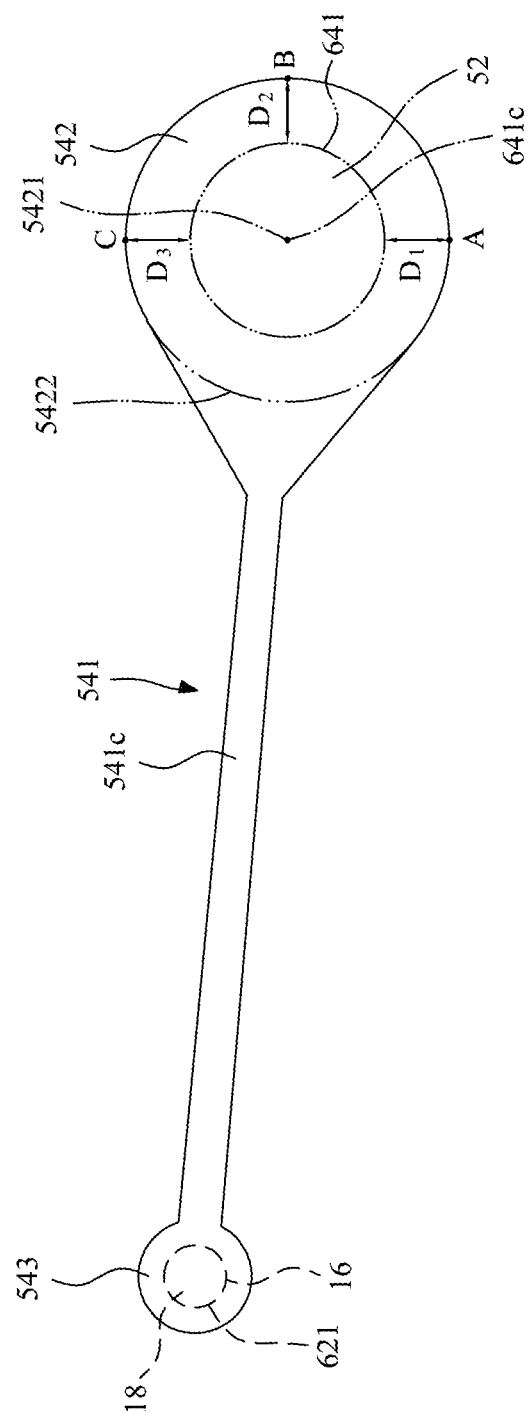
FIG. 3 illustrates a schematic enlarged top view of one of the conductive trace and the conductive pads of the interconnection structure of FIG. 2, according to some embodiments of the present disclosure.

FIG. 3 illustrates a schematic enlarged top view of one of the conductive trace 541 and the conductive pads 542, 543 of the interconnection structure 54 of FIG. 2. In some embodiments, the conductive trace 541 may be the trace 541c. The conductive pad 542 may include a circular contact area 5422 having a central axis 5421. A distance D1 is defined as the distance or gap between the sidewall of the opening 641 of the second dielectric layer 64 and the periphery edge of the conductive pad 542 (e.g., the capture lands) of the interconnection structure 54 at point A. A distance D2 is defined as the distance or gap between the sidewall of the opening 641 of the second dielectric layer 64 and the periphery edge of the conductive pad 542 (e.g., the capture lands) of the interconnection structure 54 at point B. A distance D3 is defined as the distance or gap between the sidewall of the opening 641 of the second dielectric layer 64 and the periphery edge of the conductive pad 542 (e.g., the capture lands) of the interconnection structure 54 at point C. As stated above, the center 641c of the opening 641 of the second dielectric layer 64 may be substantially disposed at the central axis 5421 of the circular contact area 5422 of the conductive pad 542 (e.g., the capture lands) of the interconnection structure 54, thus, the distances D1, D2, D3 may be substantially equal to each other. That is, the distances or gaps between the sidewall of the opening 641 of the second dielectric layer 64 and the periphery edge of the circular contact area 5422 of the conductive pad 542 (e.g., the capture lands) of the interconnection structure 54 at all positions may be substantially equal to each other. The opening 641 of the second dielectric layer 64 and the circular contact area 5422 of the conductive pad 542 may be substantially concentric. In some embodiments, the minimum one of the distances (e.g., the D1, D2, D3) or gaps between the sidewall of the opening 641 of the second dielectric layer 64 and the periphery edge of the circular contact area 5422 of the conductive pad 542 (e.g., the capture lands) of the interconnection structure 54 may be equal to or greater than 3 μm. Thus, the opening 641 of the second dielectric layer 64 is ensured to be disposed within the conductive pad 542 (e.g., the capture lands) of the interconnection structure 54, and the size of the conductive pad 542 (e.g., the capture lands) of the interconnection structure 54 is not needed to be enlarged to fit the opening 641 of the second dielectric layer 64. In some embodiments, a ratio of a radius of the opening 641 of the second dielectric layer 64 to a radius of the circular contact area 5422 of the conductive pad 542 is in a range of 0.5 to 1.0. For example, the radius of the opening 641 of the second dielectric layer 64 may be 20 μm, the radius of the circular contact area 5422 of the conductive pad 542 may be 30 μm, thus, the ratio is 2/3. In addition, the center of the opening 621 of the first dielectric layer 62 may be substantially disposed at the central axis of the conductive pad 543 of the interconnection structure 54, or at the central axis of the interconnector 16. As a result, the electrical connection between the UBM 66 and the conductive pad 542 (e.g., the capture land), and the electrical connection between the conductive pad 543 and the interconnector 16 are improved.

Figure 3A:
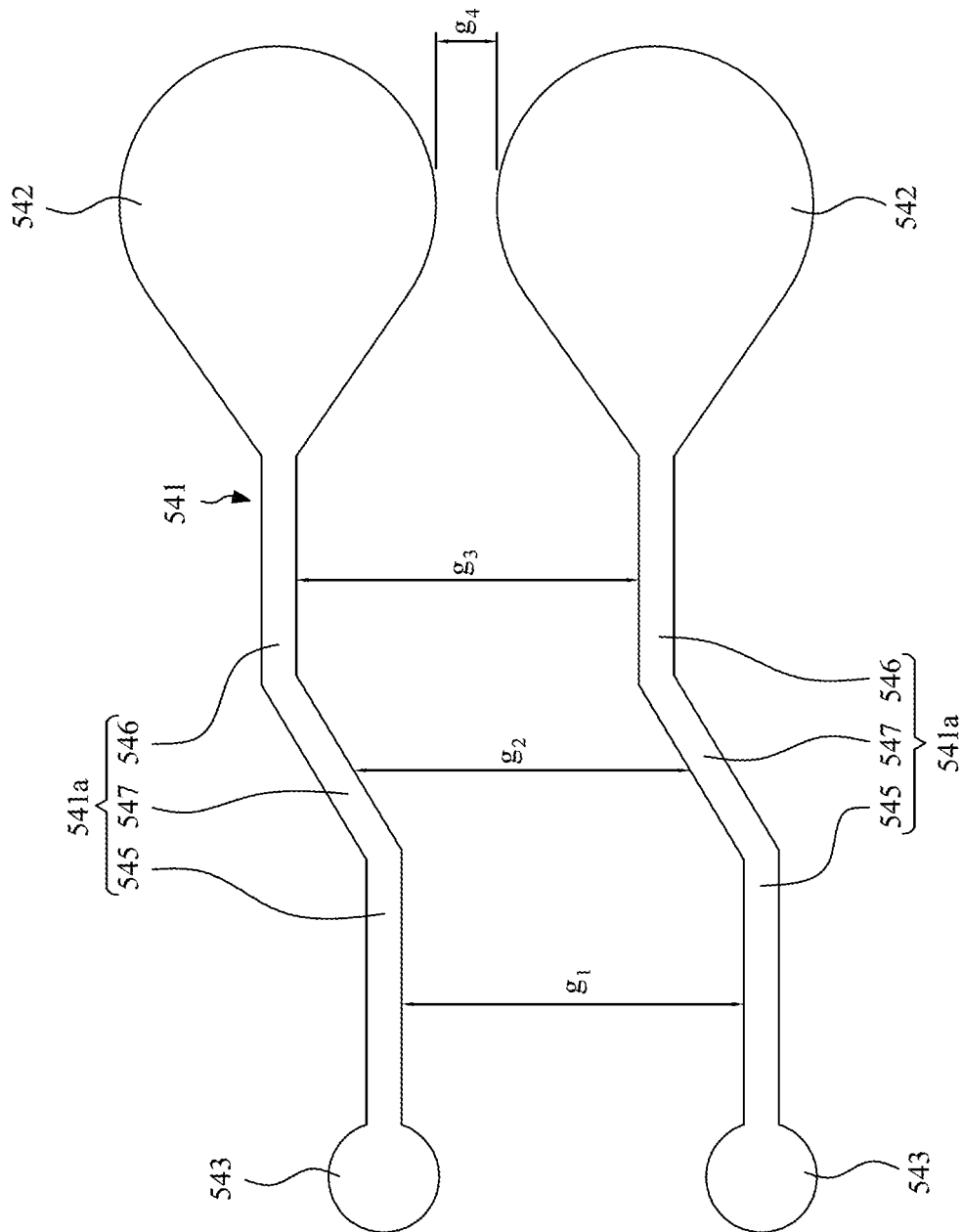
FIG. 3A illustrates a schematic enlarged top view of two adjacent conductive traces and the conductive pads of the interconnection structure of FIG. 2, according to some embodiments of the present disclosure.

FIG. 3A illustrates a schematic enlarged top view of two adjacent conductive traces 541 and the conductive pads 542, 543 of the interconnection structure 54 of FIG. 2. In some embodiments, the interconnection structure 54 may include a plurality of signal traces, a plurality of power traces, and a plurality of ground traces. The conductive traces 541 of FIG. 3 may be signal traces such as a differential pair. In some embodiments, the conductive traces 541 may be two parallel traces 541a. As stated above, the design rule may include a consistency of a gap (or space) between two adjacent conductive traces 541 (e.g., the traces 541a). That is, all the gaps (or spaces) between the segments of two conductive traces 541 are substantially equal to each other. For example, a gap "$g_1$" is between the first segments 545 of two adjacent traces 541a, a gap "$g_3$" is between the second segments 546 of the traces 541a, a gap "$g_2$" is between the third segments 547 of the traces 541a, and "$g_1$", "$g_2$", "$g_3$" are substantially equal to each other. In some embodiments, the gap (or space) "$g_1$" (or "$g_2$", "$g_3$") may be greater than 2 μm. In some embodiments of the present disclosure, the gaps (or spaces) "$g_1$", "$g_2$", "$g_3$" may not be equal to each other.

The conductive traces 541 of FIG. 3 may be signal traces such as a differential pair. The two signals in a differential pair (e.g., the two adjacent conductive traces 541) will create electromagnetic fields that are equal in magnitude but opposite in polarity. For example, the voltage in the upper conductive trace 541 of FIG. 3 may be +5V, and the voltage in the lower conductive trace 541 of FIG. 3 may be −5V, thus, the voltage in the differential pair (e.g., the two adjacent conductive traces 541) may be 10V. If the two adjacent conductive traces 541 are too close (e.g., the gap therebetween is less than the width of the conductive trace 541, or less than 2 μm) due to the shift and/or rotation of the first semiconductor device 1, the signals transmitted in the two adjacent conductive traces 541 may interfere with each other (such as capacitive coupling, parasitic capacitance, parasitic inductance, and so on), due to generated noise. Thus, the voltage in the upper conductive trace 541 of FIG. 3 may be less than +5V such as +4V, and the voltage in the lower conductive trace 541 of FIG. 3 may be greater than −5V such as −4V, and the voltage in the differential pair (e.g., the two adjacent conductive traces 541) may be 8V, in order to reduce voltage.

To address such concern, in some embodiments of the present disclosure, a minimum gap (or space) "$g_1$" (or "$g_2$", "$g_3$") between two adjacent conductive traces 541 may be greater than a width of the conductive trace 541 or may be greater than 2 μm even when the first semiconductor device 1 shifts or rotates, so that signals transmitted in the conductive traces 541 do not interfere with each other and do not generate noise.

Figure 3B:
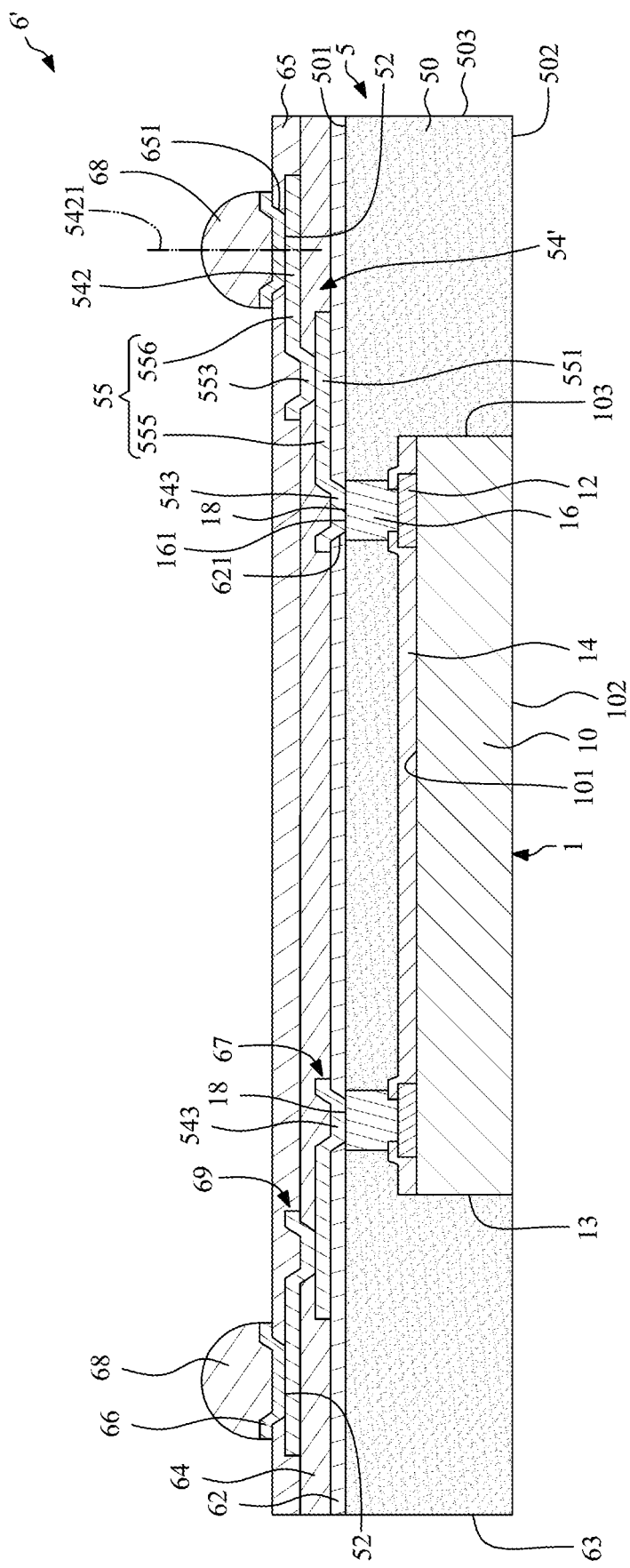
FIG. 3B illustrates a cross-sectional view of a semiconductor package structure according to some embodiments of the present disclosure.
Figure 3C:
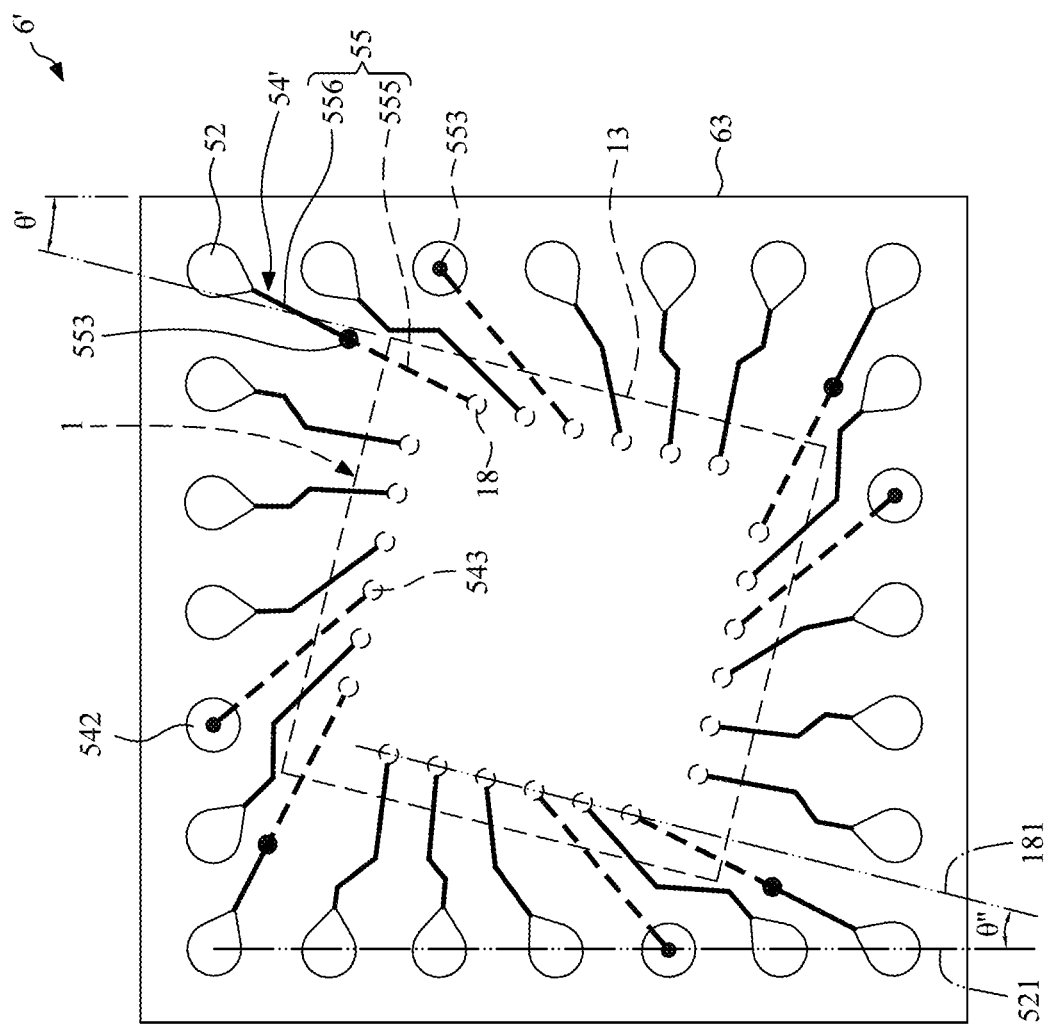
FIG. 3C illustrates a schematic top view of the semiconductor package structure of FIG. 3B, with the third dielectric layer, the UBMs, and the external connectors being omitted, according to some embodiments of the present disclosure.

FIG. 3B illustrates a cross-sectional view of a semiconductor package structure 6' according to some embodiments of the present disclosure. FIG. 3C illustrates a schematic top view of the semiconductor package structure 6' of FIG. 3B, with the third dielectric layer 65, the UBMs 66, and the external connectors 68 being omitted. The semiconductor package structure 6' is similar to the semiconductor package structure 6 shown in FIG. 1 and FIG. 2, except that the semiconductor package structure 6' includes two circuit layers (e.g., a first circuit layer 67 and a second circuit layer 69) that form an interconnection structure 54', and further includes a third dielectric layer 65. In addition, the intersection angle θ' formed between the extension of the periphery side surface 13 of the first semiconductor device 1 and the extension of the periphery side surface 63 of the semiconductor package structure 6' is greater than the intersection angle $θ_1$ formed between the extension of the periphery side surface 13 of the first semiconductor device 1 and the extension of the periphery side surface 63 of the semiconductor package structure 6. Further, an intersection angle θ'' formed between the first imaginary line 181 and the second imaginary line 521 of the semiconductor package structure 6' is greater than the intersection angle $θ_1$, formed between the first imaginary line 181 and the second imaginary line 521 of the semiconductor package structure 6.

The first circuit layer 67 may include at least one segment 555 and a plurality of conductive pads 543, 551. The segment 555 extends between the conductive pads 543, 551. One end of the segment 555 connects to the conductive pad 543, and the other end of the segment 555 connects to the conductive pad 551. The segment 555 and the conductive pads 543, 551 are formed concurrently. The second dielectric layer 64 may cover the first dielectric layer 62 and the first circuit layer 67, and may define a plurality of openings to expose the conductive pads 551 (e.g., the capture lands). Thus, the openings of the second dielectric layer 64 may be disposed right above the conductive pads 551 (e.g., the capture lands).

The second circuit layer 69 may be disposed on the second dielectric layer 64 and in the openings of the second dielectric layer 64. The second circuit layer 69 may include at least one segment 556, at least one conductive via 553, and at least one conductive pad 542. The conductive via 553 is disposed in the opening of the second dielectric layer 64. The segment 556 extends between the conductive via 553 and the conductive pad 542. One end of the segment 556 connects to the conductive via 553, and the other end of the segment 556 connects to the conductive pad 542. The segment 556, the conductive via 553 and the conductive pad 542 are formed concurrently. The third dielectric layer 65 may cover the second dielectric layer 64 and the second circuit layer 69, and may define a plurality of openings 651 to expose the conductive pads 542 (e.g., the capture lands). The UBMs 66 may be formed on a top surface of the third dielectric layer 65 and in the openings 651 of the third dielectric layer 65 so as to contact the conductive pads 542 (e.g., the capture lands). As shown in FIG. 3B, the bottom surface of the UBM 66 may contact the conductive pad 542 (e.g., the capture lands), and may be defined as the second electrical contact 52.

As shown in FIG. 3, since the intersection angle θ' (or the intersection angle θ") is relative large, two adjacent conductive traces may be too close to satisfy predetermined electrical performance threshold. Alternatively, a conductive pad 543 and a conductive trace adjacent to the conductive pad 543 may be too close to satisfy the predetermined electrical performance threshold. Thus, one or more additional circuit layers (e.g., the second circuit layer 69) may be added. Taking the conductive trace 55 for example, a portion (e.g., the segment 555) of the conductive trace 55 is in the first circuit layer 67, a portion (e.g., the segment 556) of the conductive trace 55 is in the second circuit layer 69, and the two portions (e.g., the segments 555, 556) of the conductive trace 55 are connected to each other through the conductive via 553. Thus, the conductive trace 55 is used for electrically connecting the first electrical contacts 18 (or the conductive pads 543) and the second electrical contacts 52 (or the conductive pads 542) through the two portions (e.g., the segments 555, 556) of the conductive trace 55 that are disposed at different levels. Thus, the interconnection structure 54' includes a plurality of circuit layers (e.g., the first circuit layer 67 and the second circuit layer 69) electrically connected to one another.

As shown in FIG. 3C, a projection of all of the circuit layers (e.g., the first circuit layer 67 and the second circuit layer 69) may not satisfy a predetermined electrical performance criterion. That is, if the interconnection structure 54' includes only one circuit layer, it may not satisfy predetermined electrical performance threshold. To address such concern, the interconnection structure 54' of FIG. 3 and FIG. 4 includes a plurality of circuit layers (e.g., the first circuit layer 67 and the second circuit layer 69) to avoid any situation that does not satisfy the requirement satisfying a predetermined electrical performance criterion. As a result, the entire interconnection structure 54' may satisfy the predetermined electrical performance threshold.

Figure 4:
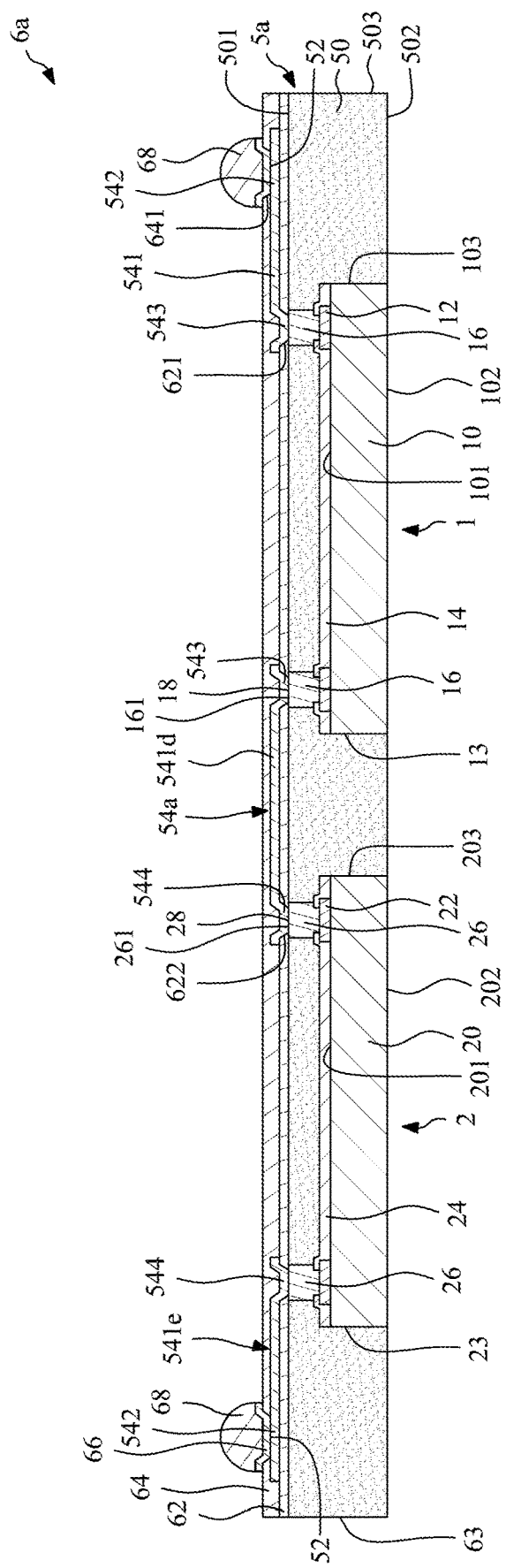
FIG. 4 illustrates a cross-sectional view of a semiconductor package structure according to some embodiments of the present disclosure.
Figure 5:
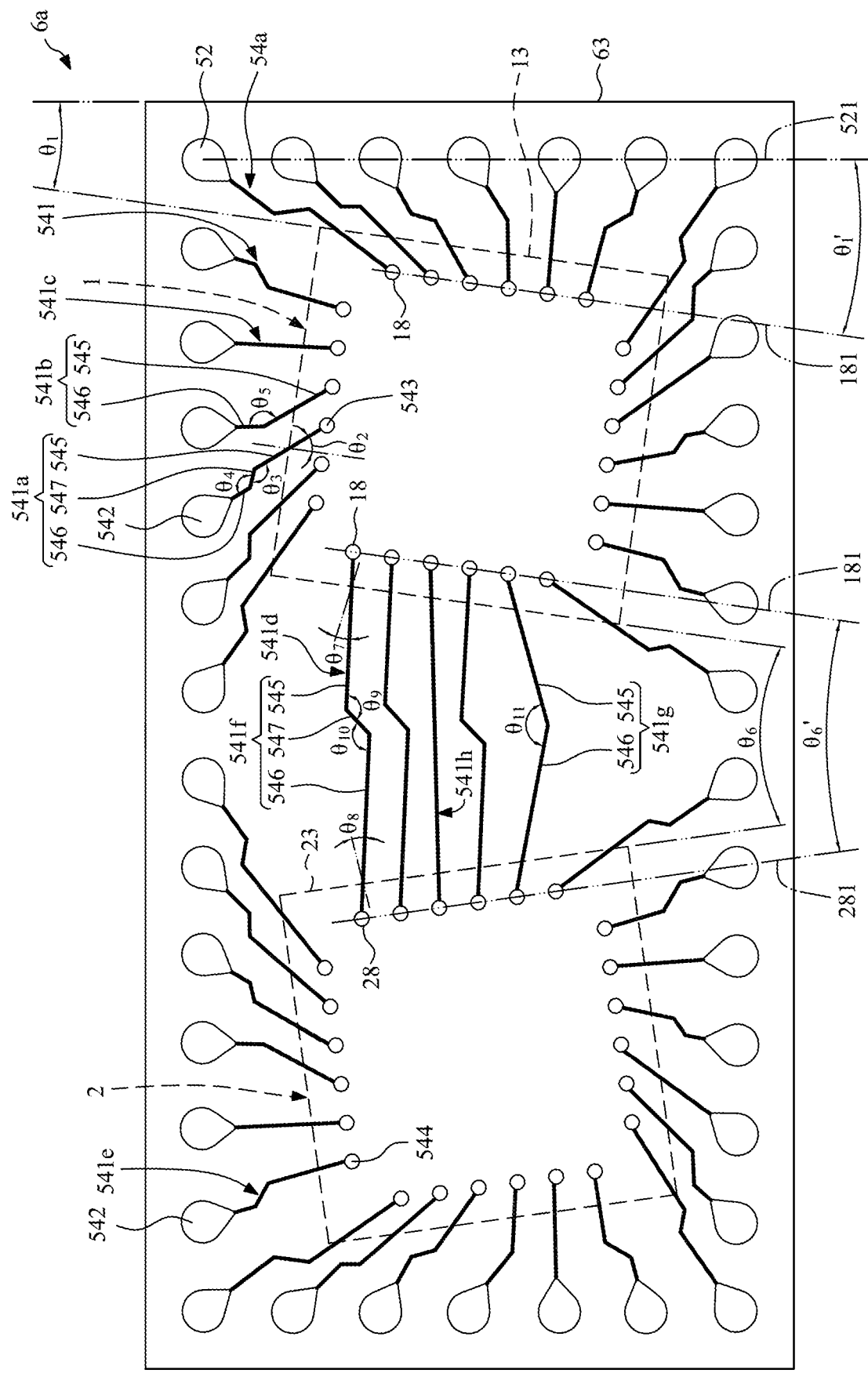
FIG. 5 illustrates a schematic top view of the semiconductor package structure of FIG. 4, with the second dielectric layer, the UBMs, and the external connectors being omitted according to some embodiments of the present disclosure.

FIG. 4 illustrates a cross-sectional view of a semiconductor package structure 6a according to some embodiments of the present disclosure. FIG. 5 illustrates a schematic top view of the semiconductor package structure 6a of FIG. 4, with the second dielectric layer 64, the UBMs 66, and the external connectors 68 being omitted. The semiconductor package structure 6a is similar to the semiconductor package structure 6 shown in FIG. 1 and FIG. 2, except that the package body 5a further includes a second semiconductor device 2 disposed side by side with the first semiconductor device 1, and the interconnection structure 54a further includes a plurality of conductive traces 541d, a plurality of conductive pads 544 and a plurality of conductive traces 541e. As shown in FIG. 5, the dashed lines may represent the initial positions (or the predetermined positions) of the first semiconductor device 1 and the second semiconductor device 2 before molding process, and the solid lines may represent the actual positions of the first semiconductor device 1 and the second semiconductor device 2 after the molding process.

The second semiconductor device 2 may be disposed outside the first semiconductor device 1, and may include a base material 20, a plurality of die pads 22, a passivation layer 24 and a plurality of interconnectors 26. The base material 20 may include silicon, and may have a first surface 201 (e.g., an active surface), a second surface 202 (e.g., a backside surface) opposite to the first surface 201, and a lateral side surface 203 extending between the first surface 201 and the second surface 202. In some embodiments, the second surface 202 and the lateral side surface 203 of the base material 20 may be a bottom surface and a lateral side surface of the second semiconductor device 2, respectively. The die pads 22 may include copper, aluminum or gold, and may be disposed adjacent to the first surface 201 of the base material 20. The passivation layer 24 may cover the first surface 201 of the base material 20 and periphery portions of the die pads 22, and may define a plurality of openings to expose central portions of the die pads 22. The interconnectors 26 may be bumps, studs or pillars, and may be disposed in the openings of the passivation layer 24 and contact the die pads 22. In some embodiments, the interconnectors 26 may include conductive metal such as copper. Each of the interconnectors 26 may have a first surface 261 (e.g., a top surface). The size and function of the second semiconductor device 2 may be same as or different from the size and function of the first semiconductor device 1.

The encapsulant 50 may cover the first semiconductor device 1 and the second semiconductor device 2. The second surface 502 (e.g., the bottom surface) of the encapsulant 50 may be substantially coplanar with the second surface 102 of the base material 10 of the first semiconductor device 1 and the second surface 202 of the base material 20 of the second semiconductor device 2. Further, the first surface 501 (e.g., the top surface) of the encapsulant 50 may be substantially coplanar with the first surface 161 (e.g., the top surface) of the interconnector 16 and the first surface 261 (e.g., the top surface) of the interconnector 26. Thus, the first surfaces 261 of the interconnectors 26 may be exposed from the first surface 501 of the encapsulant 50, and may be defined as a plurality of second electrical contacts 28 that are disposed adjacent to the first surface 201 (e.g., the active surface) of the second semiconductor device 2. In some embodiments, the interconnectors 26 may be omitted, and the die pads 22 may be exposed from the first surface 501 of the encapsulant 50, and may be defined as the second electrical contacts 28. The first electrical contacts 18 of the first semiconductor device 1 and the second electrical contacts 28 of the second semiconductor device 2 are exposed from the first surface 501 (e.g., a top surface) of the encapsulant 50.

The first dielectric layer 62 may further define a plurality of openings 622 to expose the first surfaces 261 of the interconnectors 26. Thus, the openings 622 of the first dielectric layer 62 may be disposed right above the first surfaces 261 of the interconnectors 26. That is, the openings 622 of the first dielectric layer 62 may be aligned with the interconnectors 26. Further, the conductive pads 544 may be disposed in the openings 622 of the first dielectric layer 62 and contact the first surfaces 261 of the interconnectors 26. The conductive traces 541d extend between the conductive pads 543, 544. One end of the conductive trace 541d connects to the conductive pad 543, and the other end of the conductive trace 541d connects to the conductive pad 544. Thus, a portion (e.g., the conductive traces 541d) of the interconnection structure 54a connects the first electrical contacts 18 and the second electrical contacts 28. The whole interconnection structure 54a satisfies a predetermined electrical performance threshold. In some embodiments, the conductive traces 541d and the conductive pads 543, 544 may be formed integrally and concurrently. The conductive trace 541d may be a monolithic trace extending from the conductive pad 543 to the conductive pad 544. In addition, the second dielectric layer 64 may cover the first dielectric layer 62 and the interconnection structure 54a.

As shown in FIG. 5, the second semiconductor device 2 may have a periphery side surface 23 which may be the lateral side surface 203 of the base material 20. The semiconductor package structure 6a may have a periphery side surface 63 which may be the lateral side surface 503 of the encapsulant 50. The periphery side surface 23 of the second semiconductor device 2 may be misaligned with the periphery side surface 63 of the semiconductor package structure 6, and also misaligned with the periphery side surface 13 of the first semiconductor device 1. That is, the periphery side surface 23 of the second semiconductor device 2 may not be parallel with the periphery side surface 63 of the semiconductor package structure 6 and the periphery side surface 13 of the first semiconductor device 1. Thus, the first electrical contacts 18 includes a first row of first electrical contacts 18, the second electrical contacts 28 includes a second row of second electrical contacts 28, and the nearest first row of first electrical contacts 18 and the second row of second electrical contacts 28 are not parallel with each other. An intersection angle $\theta_6$ may be formed between the extension of the periphery side surface 23 of the second semiconductor device 2 and the extension of the periphery side surface 13 of the first semiconductor device 1. In some embodiments, the intersection angle $\theta_6$ may be greater than zero degree and less than 45 degrees. In addition, the second electrical contacts 28 may be arranged to be at least one row, and a third imaginary line 281 may extend through a row (e.g., an outermost row) of the second electrical contacts 28. The third imaginary line 281 may extend through the centers of the second electrical contacts 28 in such row. An intersection angle $\theta_{6'}$ is formed between the first imaginary line 181 and the third imaginary line 281, and the intersection angle $\theta_{6'}$ may be substantially equal to the intersection angle $\theta_6$. That is, the row of the first electrical contacts 18 may not be parallel with the row of the second electrical contacts 28. The formation of the intersection angles $\theta_6$, $\theta_{6'}$ is due to the rotation of the first semiconductor device 1 and/or the rotation of the second semiconductor device 2 during a molding process by applying the encapsulant 50.

As shown in FIG. 5, the conductive traces 541*d* may include at least one trace 541*f*, at least one trace 541*g*, and at least one trace 541*h*. The trace 541*f* may include at least one first segment 545, at least one second segment 546, and at least one third segment 547. The first segment 545 is directly connected to the first electrical contact 18 (or the conductive pad 543), and an intersection angle $\theta_7$ is formed between the first segment 545 and a normal direction of the periphery side surface 13 of the first semiconductor device 1. That is, the first segment 545 is oblique or not perpendicular to the periphery side surface 13 of the first semiconductor device 1. The intersection angle $\theta_7$ may be greater than or equal to 0.5 degree and less than or equal to 45 degrees. The second segment 546 is directly connected to the second electrical contact 28 (or the conductive pad 544), and may be substantially parallel with the first segment 545. An intersection angle $\theta_8$ is formed between the second segment 546 and a normal direction of the periphery side surface 23 of the second semiconductor device 2. That is, the second segment 546 is oblique or not perpendicular to the periphery side surface 23 of the second semiconductor device 2. The intersection angle $\theta_8$ may be greater than or equal to 0.5 degree and less than or equal to 45 degrees. The third segment 547 intersects with the first segment 545 at an intersection angle $\theta_9$, and the third segment 547 intersects with the second segment 546 at an intersection angle $\theta_{10}$. The intersection angle $\theta_9$ may be substantially equal to the intersection angle $\theta_{10}$. For example, both of the intersection angle $\theta_9$ and the intersection angle $\theta_{10}$ may be about 135 degrees.

The trace 541*g* may include at least one first segment 545 and at least one second segment 546. The first segment 545 intersects with the second segment 546 at an intersection angle 011 which may be about 135 degrees. The trace 541*h* may be a substantially straight line. As shown in FIG. 5, the trace 541*f* has two turning points, the trace 541*g* has one turning point, and the trace 541*h* has no turning point. Thus, the count of turning point(s) of one of the conductive traces 541*d* is less than or equal to six.

As shown in the embodiment illustrated in FIG. 4 and FIG. 5, the interconnection structure 54*a* is used for directly connecting the first electrical contacts 18 (or the conductive pads 543) and the second electrical contacts 28 (or the conductive pads 544). In some embodiments, the first semiconductor device 1 and the second semiconductor device 2 may shift or rotate during a pick-and-place process and/or a molding process. That is, after the pick-and-place process and the molding process, the first electrical contacts 18 of the first semiconductor device 1 and the second electrical contacts 28 of the second semiconductor device 2 may move from the initial positions (or predetermined positions) to the actual positions. If the interconnection structure 54*a* is formed according to a simulated interconnection structure based on the initial positions of the first electrical contacts 18 of the first semiconductor device 1 and the second electrical contacts 28 of the second semiconductor device 2, the interconnection structure 54*a* will not physically connect the first electrical contacts 18 and the second electrical contacts 28 accurately, which reduces the yield rate of the semiconductor package structure 6*a*. Especially when the distance between the initial positions (or predetermined positions) and the actual positions is equal to or greater than 20 µm, the interconnection structure 54*a* will not physically connect the first electrical contacts 18 and the second electrical contacts 28, 52 unless violating the requirement satisfying a predetermined electrical performance criterion. The violation of requirement satisfying a predetermined electrical performance criterion will lead to the damage to the electrical performance and yield rate of the semiconductor package structure 6*a*. To address such concerns, as disclosed herein, the whole interconnection structure 54*a* is formed according to a simulated interconnection structure based on the actual positions of the first electrical contacts 18 of the first semiconductor device 1 and the second electrical contacts 28 of the second semiconductor device 2 under at least one requirement satisfying a predetermined electrical performance criterion. Thus, the whole interconnection structure 54*a* maintains the electrical connection and satisfies a predetermined electrical performance threshold/criterion even when the distance between the initial positions (or predetermined positions) and the actual positions is equal to or greater than 20 µm. As a result, the electrical performance and the yield rate of the semiconductor package structure 6*a* may be improved.

In some embodiments, the requirement satisfying a predetermined electrical performance criterion may be achieved by the design rules such as but not limited to, values of one or more of the following parameters meeting a predetermined threshold: a line width/line space (L/S) of the conductive traces 541*d*, a length of the conductive trace 541*d*, a consistency of a width of the conductive trace 541*d*, a size of the conductive pads 543, 544, a space between the conductive pads 543, 544 and an adjacent conductive trace 541*d*, a ratio of an actual length of the conductive trace 541*d* to a distance between the first electrical contacts 18 and the second electrical contacts 28, a size of the opening 641 of the second dielectric layer 64, a space between the openings 641 of the first dielectric layer 64, or a consistency of a gap (or space) between two adjacent conductive traces 541*d*. For example, the line width and space of the conductive traces 541*d* being equal to or greater than 10 µm and 3 µm, respectively satisfies the requirement satisfying a predetermined electrical performance criterion and meet the manufacturing requirement.

The conductive traces 541*e* of the interconnection structure 54*a* are used to connect the second electrical contacts 28 (or the conductive pads 544) and the second electrical contacts 52 (or the conductive pads 542), and are similar to the conductive traces 541.

FIG. 6 through FIG. 17 illustrate a method for manufacturing a semiconductor package structure according to some embodiments of the present disclosure. In some embodiments, the method is for manufacturing the semiconductor package structure 6*a* shown in FIG. 4 and FIG. 5.

Referring to FIG. 6 through FIG. 10, a package body 5*a*' is provided. The package body 5*a*' may include a first semiconductor device 1, a second semiconductor device 2 and an encapsulant 50 covering the first semiconductor device 1 and the second semiconductor device 2. The package body 5*a*' is manufactured as follows.

Figure 6:
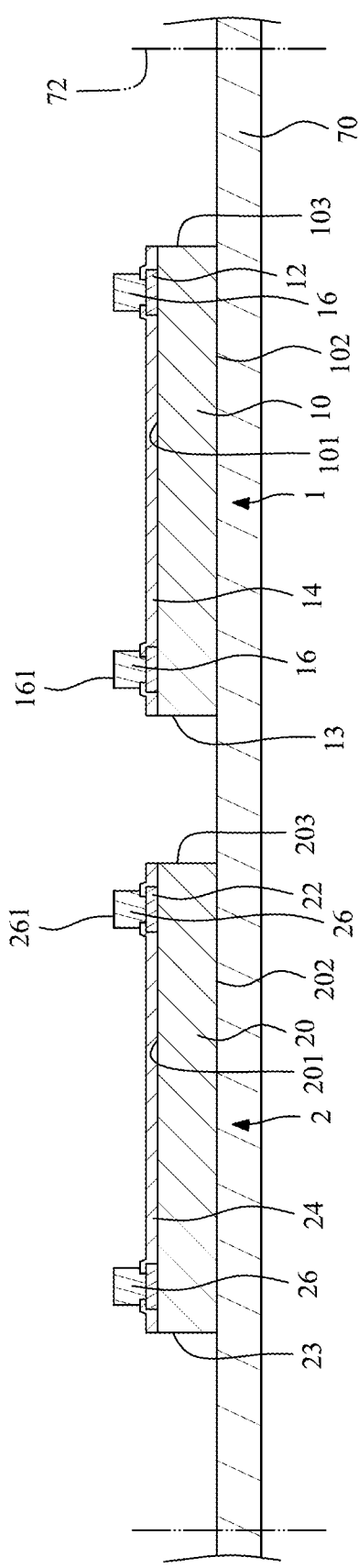
FIG. 6 illustrates one or more stages of an example of a method for manufacturing a semiconductor package structure according to some embodiments of the present disclosure.

Referring to FIG. 6, the first semiconductor device 1 and the second semiconductor device 2 may be disposed on a carrier 70 side by side. The carrier 70 may be a glass carrier, and may be in a wafer type, a panel type or a strip type. The carrier 70 may have a plurality of cutting lines 72 intersecting with each other and surrounding the first semiconductor device 1 and the second semiconductor device 2. The first semiconductor device 1 may include a base material 10, a plurality of die pads 12, a passivation layer 14 and a plurality of interconnectors 16. The base material 10 may have a first surface 101 (e.g., an active surface), a second surface 102 (e.g., a backside surface) opposite to the first surface 101, and a lateral side surface 103 extending between the first surface 101 and the second surface 102. The second surface 102 may be attached to the carrier 70. The die pads 12 may be disposed adjacent to the first surface 101 of the base material 10. The passivation layer 14 may cover the first surface 101 of the base material 10 and periphery portions of the die pads 12, and may define a plurality of openings to expose central portions of the die pads 12. The interconnectors 16 may be disposed in the openings of the passivation layer 14 and contact the die pads 12. Each of the interconnectors 16 may have a first surface 161 (e.g., a top surface).

The second semiconductor device 2 may include a base material 20, a plurality of die pads 22, a passivation layer 24 and a plurality of interconnectors 26. The base material 20 may have a first surface 201 (e.g., an active surface), a second surface 202 (e.g., a backside surface) opposite to the first surface 201, and a lateral side surface 203 extending between the first surface 201 and the second surface 202. The second surface 202 may be attached to the carrier 70. The die pads 22 may be disposed adjacent to the first surface 201 of the base material 20. The passivation layer 24 may cover the first surface 201 of the base material 20 and periphery portions of the die pads 22, and may define a plurality of openings to expose central portions of the die pads 22. The interconnectors 26 may be disposed in the openings of the passivation layer 24 and contact the die pads 22. Each of the interconnectors 26 may have a first surface 261 (e.g., a top surface).

Figure 7:
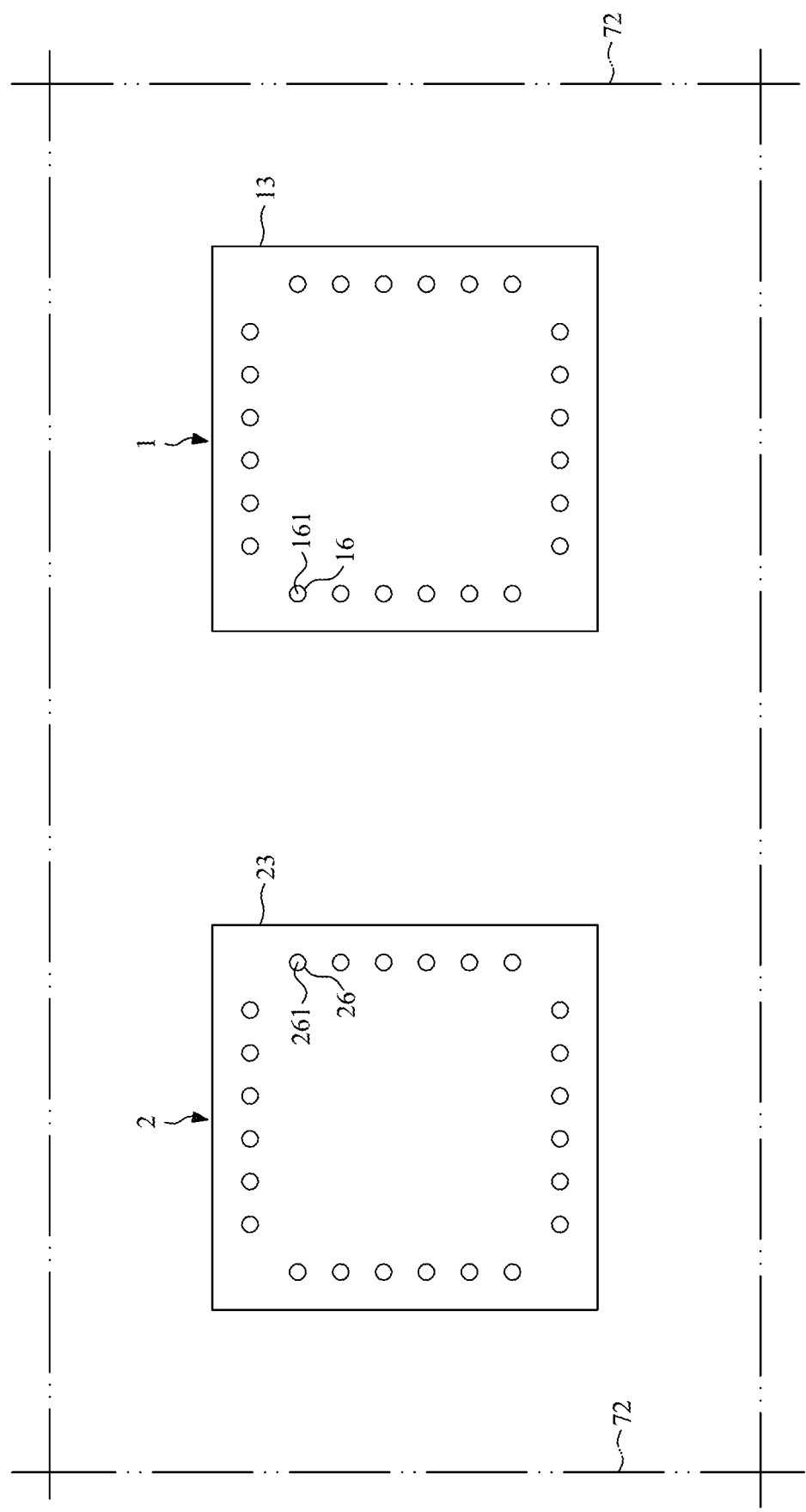
FIG. 7 illustrates one or more stages of an example of a method for manufacturing a semiconductor package structure according to some embodiments of the present disclosure.

Referring to FIG. 7, a top view of FIG. 6 is illustrated. The first semiconductor device 1 and the second semiconductor device 2 may be located at initial positions that are the same as the predetermined positions. That is, the first semiconductor device 1 and the second semiconductor device 2 may not shift or rotate during the pick-and-place process. The periphery side surface 23 of the second semiconductor device 2 may be parallel with the cutting lines 72 of the carrier 70 and the periphery side surface 13 of the first semiconductor device 1. However, in some embodiments, the first semiconductor device 1 and the second semiconductor device 2 may shift or rotate during the pick-and-place process, thus, the initial positions of the first semiconductor device 1 and the second semiconductor device 2 may be different from the predetermined positions.

Figure 8:
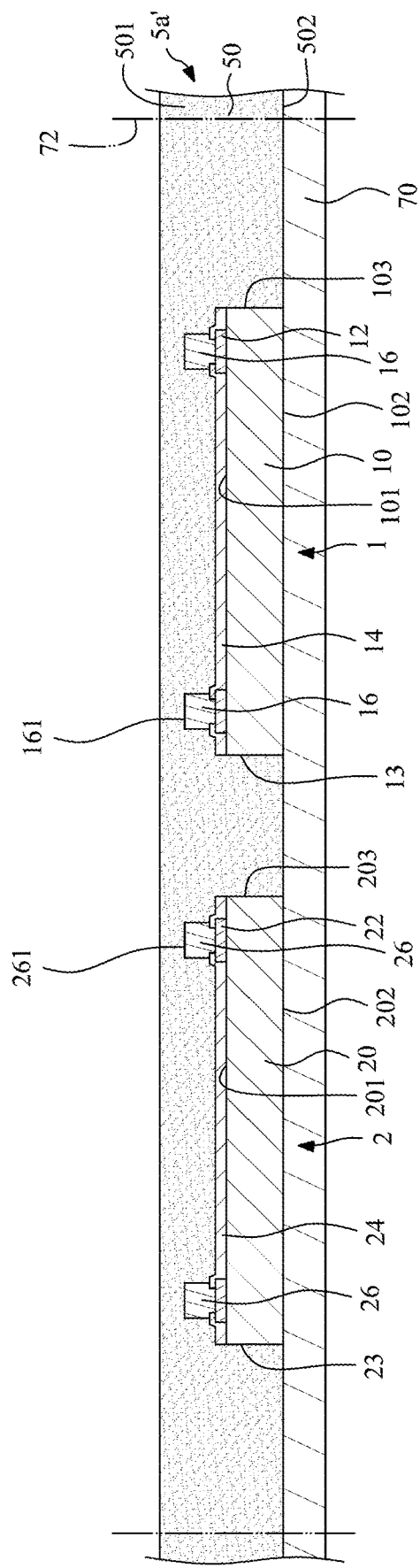
FIG. 8 illustrates one or more stages of an example of a method for manufacturing a semiconductor package structure according to some embodiments of the present disclosure.

Referring to FIG. 8, the first semiconductor device 1 and the second semiconductor device 2 may be encapsulated by an encapsulant 50. The encapsulant 50 may have a first surface 501 (e.g., a top surface) and a second surface 502 (e.g., a bottom surface) opposite to the first surface 501. The first surface 501 (e.g., the top surface) of the encapsulant 50 may be higher than the first surfaces 161 of the interconnectors 16 and the first surfaces 261 of the interconnectors 26.

Figure 9:
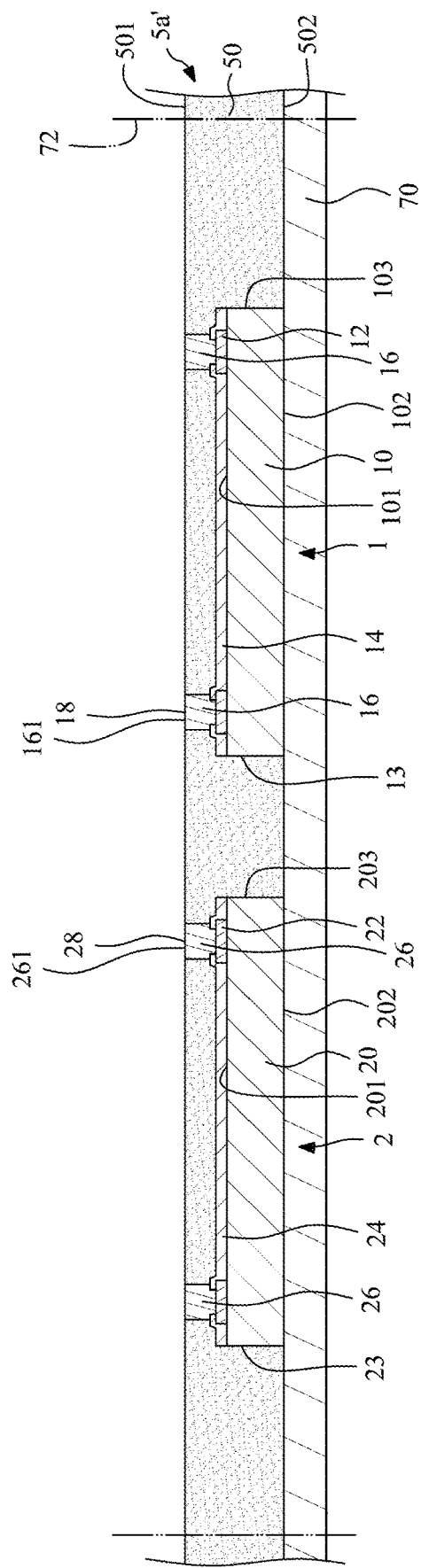
FIG. 9 illustrates one or more stages of an example of a method for manufacturing a semiconductor package structure according to some embodiments of the present disclosure.

Referring to FIG. 9, the encapsulant 50 may be thinned from its first surface 501 by, for example, grinding to form the package body 5a'. Meanwhile, the first surfaces 161 of the interconnectors 16 are coplanar with and exposed from the first surface 501 of the encapsulant 50 to form a plurality of first electrical contacts 18. Thus, the first semiconductor device 1 may include the first electrical contacts 18 disposed adjacent to the first surface 101 (e.g., the active surface) of the first semiconductor device 1, and the first electrical contacts 18 may be exposed from the first surface 501 of the encapsulant 50. In addition, the first surfaces 261 of the interconnectors 26 are coplanar with and exposed from the first surface 501 of the encapsulant 50 to form a plurality of second electrical contacts 28. Thus, the second semiconductor device 2 may include the second electrical contacts 28 disposed adjacent to the first surface 201 (e.g., the active surface) of the second semiconductor device 2, and the second electrical contacts 28 are exposed from the first surface 501 of the encapsulant 50.

Figure 10:
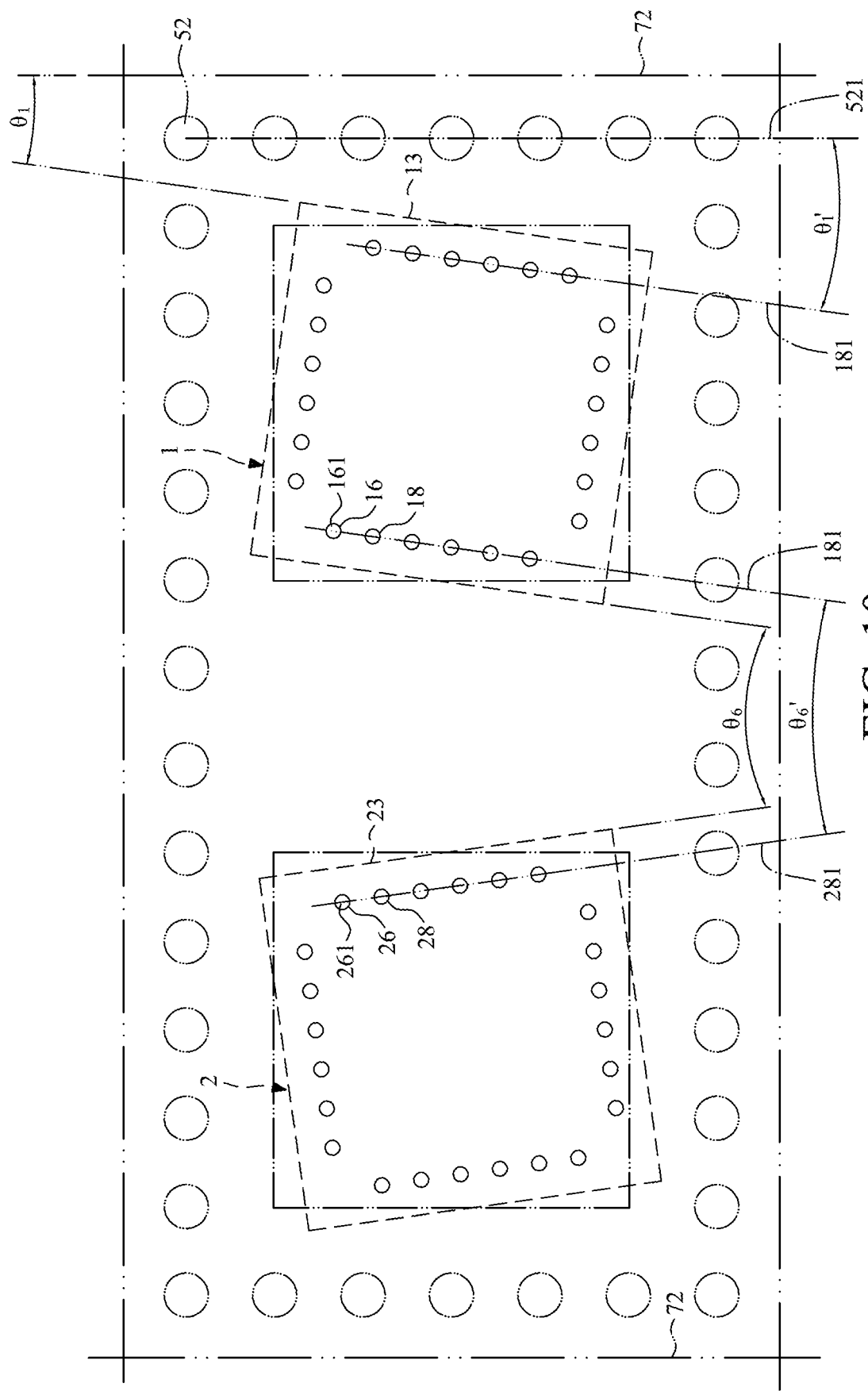
FIG. 10 illustrates one or more stages of an example of a method for manufacturing a semiconductor package structure according to some embodiments of the present disclosure.

Referring to FIG. 10, a top view of FIG. 9 is illustrated. The first semiconductor device 1 and the second semiconductor device 2 may shift or rotate during the molding process of FIG. 8. Thus, the first electrical contacts 18 (e.g., the exposed first surfaces 161 of the interconnectors 16) of the first semiconductor device 1 move from the initial positions of FIG. 7 to the actual positions of FIG. 10. That is, the first electrical contacts 18 (e.g., the exposed first surfaces 161 of the interconnectors 16) of the first semiconductor device 1 are located at actual positions of FIG. 10 that are different from the initial positions of FIG. 7. In addition, the second electrical contacts 28 (e.g., the exposed first surfaces 261 of the interconnectors 26) of the second semiconductor device 2 move from the initial positions of FIG. 7 to the actual positions of FIG. 10. That is, the second electrical contacts 28 (e.g., the exposed first surfaces 261 of the interconnectors 26) of the second semiconductor device 2 are located at actual positions of FIG. 10 that are different from the initial positions of FIG. 7. As shown in FIG. 10, an intersection angle $\theta_1$ may be formed between the extension of the periphery side surface 13 of the first semiconductor device 1 and the cutting line 72. An intersection angle $\theta_6$ may be formed between the extension of the periphery side surface 23 of the second semiconductor device 2 and the extension of the periphery side surface 13 of the first semiconductor device 1.

The actual positions of the first electrical contacts 18 (e.g., the exposed first surfaces 161 of the interconnectors 16) of the first semiconductor device 1 and the actual positions of the second electrical contacts 28 (e.g., the exposed first surfaces 261 of the interconnectors 26) of the second semiconductor device 2 are measured.

Then, a plurality of second electrical contacts 52 are provided or determined. The second electrical contacts 52 are outside the first semiconductor device 1, and are used for external connection. It is noted that the second electrical contacts 52 are predetermined electrical contacts disposed at second predetermined positions over the encapsulant 50. That is, the positions of the second electrical contacts 52 may be predetermined and fixed. It is noted that the second electrical contacts 52 may be provided or determined before the stage of FIG. 6.

Figure 11:
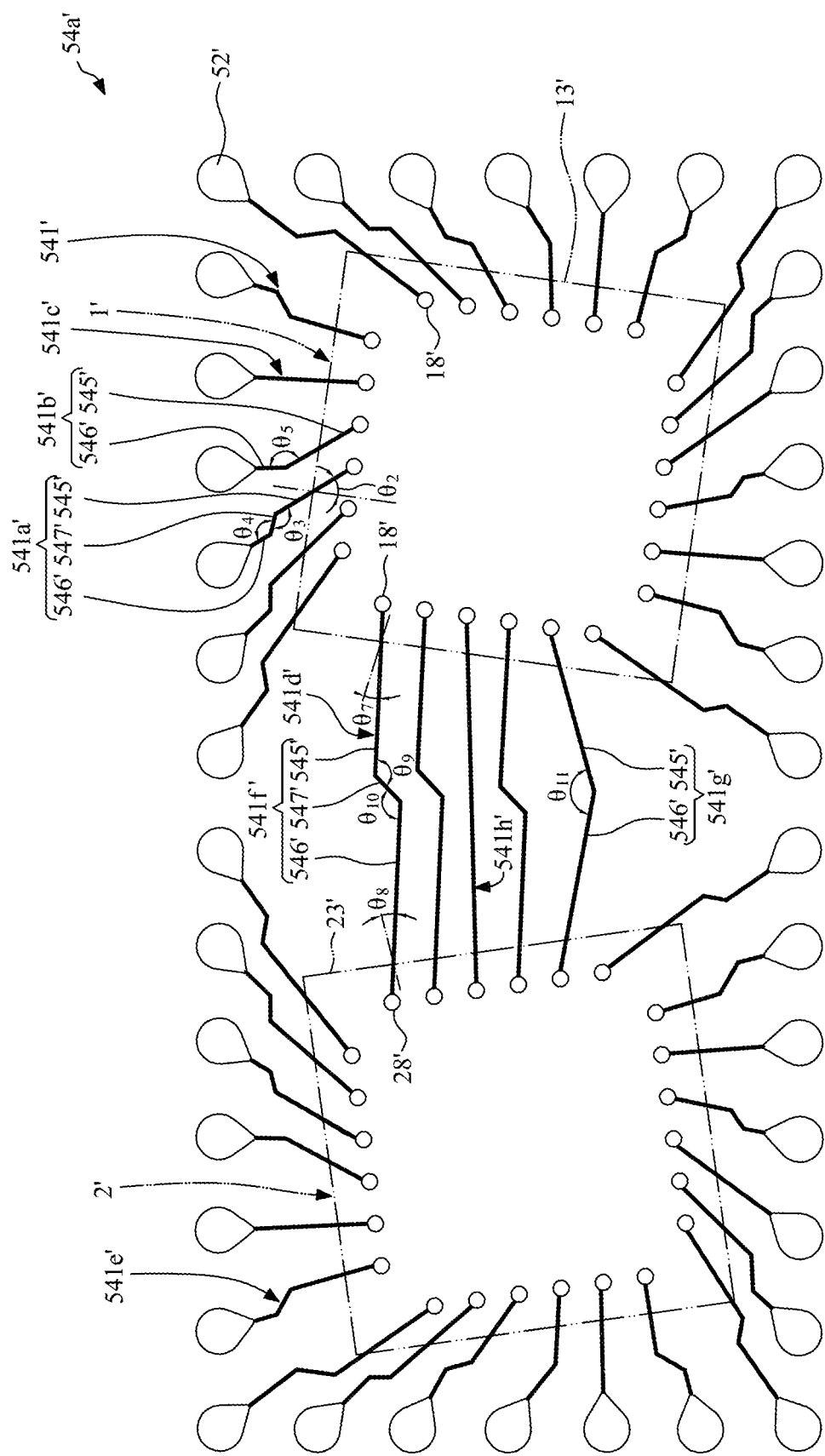
FIG. 11 illustrates one or more stages of an example of a method for manufacturing a semiconductor package structure according to some embodiments of the present disclosure.

Referring to FIG. 11, a simulated interconnection structure 54a' is illustrated. The data of the actual positions of the first electrical contacts 18, the actual positions of the second electrical contacts 28 and the second predetermined positions of the second electrical contacts 52 are input into an auto-routing module. Then, the auto-routing module generates a simulated interconnection structure 54a' based on the actual positions of the first electrical contacts 18' of the first semiconductor device 1', the actual positions of the second electrical contacts 28' of the second semiconductor device 2' and the second predetermined positions of the second electrical contacts 52' satisfying a predetermined electrical performance criterion. The simulated interconnection structure 54a' covers all of the first electrical contacts 18' the second electrical contacts 28' and the second electrical contacts 52'. That is, the simulated interconnection structure 54a' may be formed at once. The whole simulated interconnection structure 54a' satisfies a predetermined electrical performance criterion.

The simulated interconnection structure 54a' may include a plurality of simulated traces 541', 541d', 541e'. The simulated traces 541' extend from the first electrical contacts 18' to the second electrical contacts 52'. The simulated traces 541d' extend from the first electrical contacts 18' to the second electrical contacts 28'. The simulated traces 541e' extend from the second electrical contacts 28' to the second electrical contacts 52'. All of the simulated traces 541', 541d', 541e' may be generated concurrently. In some embodiments, all of the simulated traces 541', 541d', 541e' may be generated under the requirement satisfying a predetermined electrical performance criterion and only in consideration of the actual positions of the first electrical contacts 18', the actual positions of the second electrical contacts 28' and the predetermined positions of the second electrical contacts 52'.

In some embodiments, if some simulated traces 541' of the simulated interconnection structure 54a' do not satisfy the predetermined electrical performance criterion. Then, such simulated traces 541' may be adjusted (e.g., removed or regenerated) to ensure all simulated traces 541' of the simulated interconnection structure 54a' satisfy the predetermined electrical performance criterion.

As shown in FIG. 11, the simulated traces 541' may include at least one trace 541a', at least one trace 541b' and at least one trace 541c'. The trace 541a' may include at least one first segment 545', at least one second segment 546' and at least one third segment 547'. The first segment 545' is connected to the first electrical contact 18', and an intersection angle $\theta_2$ is formed between the first segment 545' and a normal direction of the periphery side surface 13' of the first semiconductor device 1'. The intersection angle $\theta_2$ may be greater than or equal to 0.5 degree and less than or equal to 45 degrees. That is, the first segment 545' may be oblique or not perpendicular to the periphery side surface 13' of the first semiconductor device 1'. The second segment 546' is connected to the second electrical contact 52', and may be substantially parallel with the first segment 545'. The third segment 547' intersects with the first segment 545' at an intersection angle θ3, and the third segment 547' intersects with the second segment 546' at an intersection angle $\theta_4$. The intersection angle $\theta_3$ may be substantially equal to the intersection angle $\theta_4$. For example, both of the intersection angle $\theta_3$ and the intersection angle $\theta_4$ may be about 135 degrees.

The trace 541b' may include at least one first segment 545' and at least one second segment 546'. The first segment 545' intersects with the second segment 546' at an intersection angle $\theta_5$ which may be about 135 degrees. The trace 541c' may be a substantially straight line. As shown in FIG. 11, the trace 541a' has two turning points, the trace 541b' has one turning point, and the trace 541c' has no turning point. Thus, the count of turning point(s) of one of the simulated traces 541' is less than or equal to six.

The simulated traces 541d' may include at least one trace 541f', at least one trace 541g' and at least one trace 541h'. The trace 541f' may include at least one first segment 545', at least one second segment 546' and at least one third segment 547'. The first segment 545' is connected to the first electrical contact 18', and an intersection angle $\theta_7$ is formed between the first segment 545' and a normal direction of the periphery side surface 13' of the first semiconductor device 1'. The intersection angle $\theta_7$ may be greater than or equal to 0.5 degree and less than or equal to 45 degrees. The second segment 546' is connected to the second electrical contact 28', and may be substantially parallel with the first segment 545'. An intersection angle $\theta_8$ is formed between the second segment 546' and a normal direction of the periphery side surface 23' of the second semiconductor device 2'. The intersection angle $\theta_8$ may be greater than or equal to 0.5 degree and less than or equal to 45 degrees. The third segment 547' intersects with the first segment 545' at an intersection angle $\theta_9$, and the third segment 547' intersects with the second segment 546' at an intersection angle $\theta_{10}$. The intersection angle $\theta_9$ may be substantially equal to the intersection angle $\theta_{10}$. For example, both of the intersection angle $\theta_9$ and the intersection angle $\theta_{10}$ may be about 135 degrees.

The trace 541g' may include at least one first segment 545' and at least one second segment 546'. The first segment 545' intersects with the second segment 546' at an intersection angle $\theta_{11}$ which may be about 135 degrees. The trace 541h' may be a substantially straight line. As shown in FIG. 11, the trace 541f has two turning points, the trace 541g' has one turning point, and the trace 541h' has no turning point. Thus, the count of turning point(s) of one of the simulated traces 541d' is less than or equal to six.

The simulated traces 541e' of the simulated interconnection structure 54a' are used to connect the second electrical contacts 28' and the second electrical contacts 52', and are similar to the simulated traces 541'.

In some embodiments, before the stage of FIG. 6, a pre-routing layout pattern including a predetermined interconnection structure may be generated by the auto-routing module based on the first predetermined positions of the first electrical contacts 18 of the first semiconductor device 1, the predetermined positions of the second electrical contacts 28 of the second semiconductor device 2 and the second predetermined positions of the second electrical contacts 52 satisfying a predetermined electrical performance threshold/criterion. In response to determining that the pre-routing layout pattern including the predetermined interconnection structure is generated successfully (e.g., satisfying a predetermined electrical performance threshold/criterion), the stage of FIG. 6 is proceeded. On the other hand, in response to determining that the pre-routing layout pattern including the predetermined interconnection structure cannot be generated successfully (e.g., does not satisfy the predetermined electrical performance threshold/criterion), the predetermined positions of the electrical contacts 18, 28, 52 and/or the design rule may be adjusted. In some embodiments, the design rule may be adjusted by one or more of adjusting the simulated traces of the predetermined interconnection structure or reducing the current design value iteratively till the pre-routing layout pattern is able to be generated.

In some embodiments, the simulated traces 541' may include one or more pre-assignment traces and one or more free-assignment traces. The pre-assignment traces may be assigned to be formed on the specific circuit layers before the simulated interconnection structure 54a' is generated. That is, the circuit layer of the pre-assignment trace is fixed and cannot be adjusted. The free-assignment traces are not assigned to be formed on the specific circuit layers, and can be adjusted in order to successfully generate the simulated interconnection structure 54a'. in response to determining that the simulated interconnection structure 54a' cannot be generated successfully in a single circuit layer, one or more additional circuit layers may be added to accommodate the simulated interconnection structure 54a'. The pre-assignment traces influence electrical performance, and the pre-assignment trace is, for example, the differential pair. In the process of generating the simulated interconnection structure 54a', the pre-assignment trace is formed on the specific circuit layer first and then the free-assignment trace is formed on the circuit layer to make sure the simulated interconnection structure 54a' is successfully generated. Therefore, the interconnection structure 54' formed according to the simulated interconnection structure 54a' may include a plurality of circuit layers (e.g., the first circuit layer 67 and the second circuit layer 69) as shown in FIG. 3B and FIG. 3C.

In some embodiments, the design rules include fixed design rules and adjustable design rules. The fixed design rules significantly influence the electrical performance and assigned to the specific values instead of being adjusted. The adjustable design rules are influence electrical performance but allow the range to be adjusted. For example, the fixed design rule is applied to the differential pair and the adjustable design rule is applied to input/output traces. In the process of generating the simulated interconnection structure 54a', the simulated traces of the fixed design rules are formed first and then the simulated traces of the adjustable design rules are formed to make sure the simulated interconnection structure 54a' is successfully generated. In some embodiments, firstly, at least one fixed portion of the simulated interconnection structure 54a' based on the actual positions of the first electrical contacts 18' of the first semiconductor device 1', the actual positions of the second electrical contacts 28' of the second semiconductor device 2' and the second predetermined positions of the second electrical contacts 52' under the requirement satisfying a predetermined electrical performance criterion is generated. For example, a gap (or space) between two adjacent simulated traces 541' is consistent. Secondly, at least one adjustable portion of the simulated interconnection structure 54a' based on the actual positions of the first electrical contacts 18' of the first semiconductor device 1', the actual positions of the second electrical contacts 28' of the second semiconductor device 2' and the second predetermined positions of the second electrical contacts 52' satisfying a predetermined electrical performance criterion is generated. Meanwhile, the simulated traces 541' in the adjustable portion are adjustable.

Figure 12:
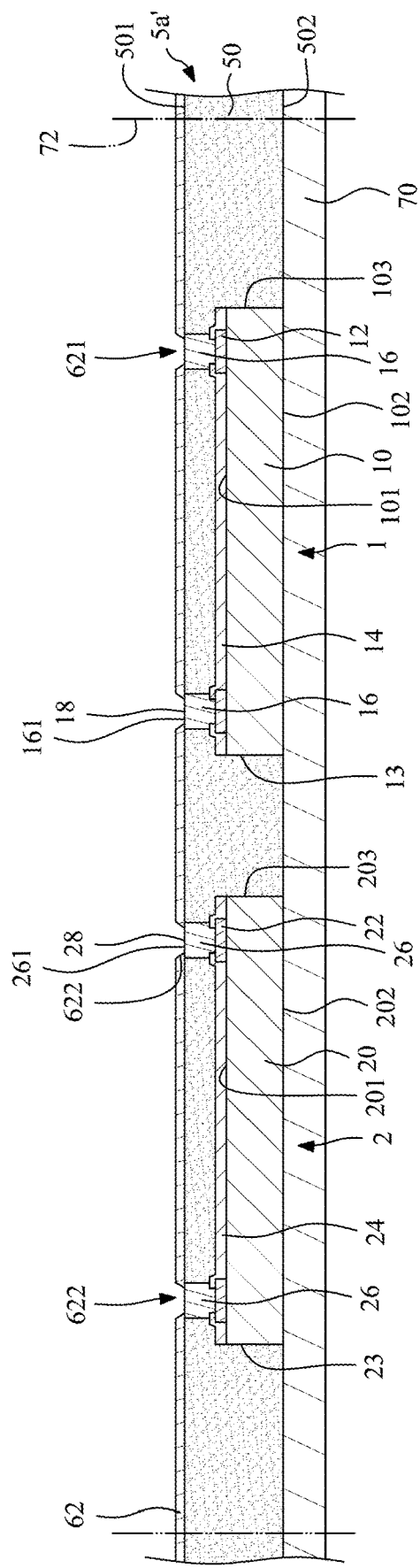
FIG. 12 illustrates one or more stages of an example of a method for manufacturing a semiconductor package structure according to some embodiments of the present disclosure.

Referring to FIG. 12, a first dielectric layer 62 may be formed or disposed to cover the encapsulant 50. Then, a plurality of openings 621, 622 may be formed in the first dielectric layer 62 to expose the first surfaces 161 of the interconnectors 16 and the first surfaces 261 of the interconnectors 26. The openings 621, 622 are formed according to the simulated interconnection structure 54a'. Thus, the positions of the first electrical contacts 18 and the second electrical contacts 28 of FIG. 12 correspond to the positions of the first electrical contacts 18' and the second electrical contacts 28' of FIG. 11, respectively.

Figure 13:
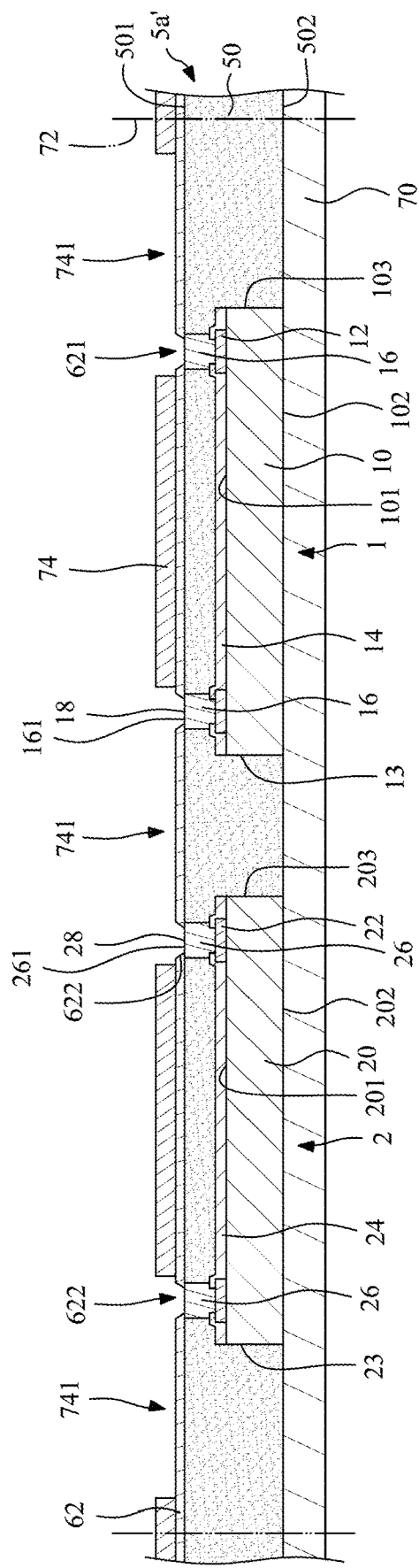
FIG. 13 illustrates one or more stages of an example of a method for manufacturing a semiconductor package structure according to some embodiments of the present disclosure.

Referring to FIG. 13, a photoresist layer 74 is formed or disposed to cover the first dielectric layer 62. Then, a plurality of openings 741 may be formed in the photoresist layer 74 to expose portions of the first dielectric layer 62 and the openings 621, 622. The openings 741 are formed according to the simulated interconnection structure 54a' by a mask-less process. Thus, the pattern of the openings 741 of FIG. 13 correspond to the simulated interconnection structure 54a' of FIG. 11.

Figure 14:
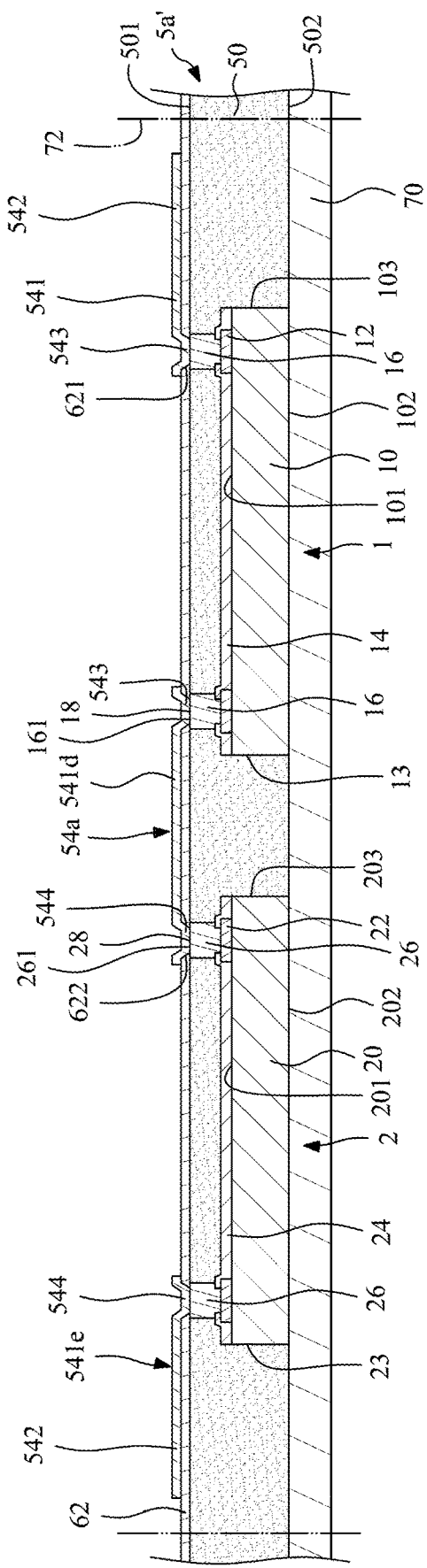
FIG. 14 illustrates one or more stages of an example of a method for manufacturing a semiconductor package structure according to some embodiments of the present disclosure.

Referring to FIG. 14, an interconnection structure 54a is formed or disposed in the openings 741 of the photoresist layer 74. Then, the photoresist layer 74 is removed. Thus, the interconnection structure 54a is formed according to the simulated interconnection structure 54a', so as to directly connect the first electrical contacts 18 and the second electrical contacts 28, 52. That is, the interconnection structure 54a is formed based on the actual positions of the first electrical contacts 18 of the first semiconductor device 1, the actual positions of the second electrical contacts 28 of the second semiconductor device 2 and the predetermined positions of the second electrical contacts 52 satisfying a predetermined electrical performance criterion. In some embodiments, the entire interconnection structure 54a is formed under the requirement satisfying a predetermined electrical performance criterion, thus, the whole interconnection structure 54a satisfies the predetermined electrical performance criterion.

The interconnection structure 54a of FIG. 14 may be the same as the interconnection structure 54a of FIG. 4 and FIG. 5, and may include a plurality of conductive traces 541, 541d, 541e and a plurality of conductive pads 542, 544. In some embodiments, the interconnection structure 54a may include a plurality of circuit layers electrically connected to one another.

Figure 15:
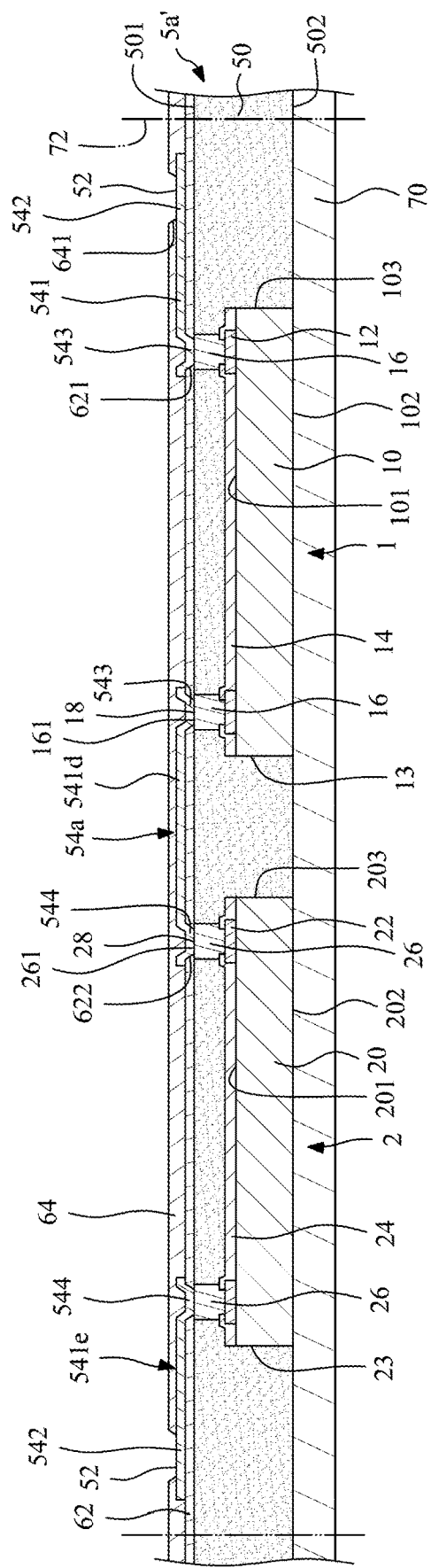
FIG. 15 illustrates one or more stages of an example of a method for manufacturing a semiconductor package structure according to some embodiments of the present disclosure.

Referring to FIG. 15, a second dielectric layer 64 may be formed or disposed to cover the first dielectric layer 62 and the interconnection structure 54a. Then, a plurality of openings 641 may be formed in the second dielectric layer 64 to expose the conductive pads 544. The openings 641 are formed according to the simulated interconnection structure 54a'. Thus, the positions of the openings 641 of FIG. 15 correspond to the positions of the second electrical contacts 52' of FIG. 11. It is noted that the exposed portions of the conductive pads 544 are the second electrical contacts 52.

Figure 16:
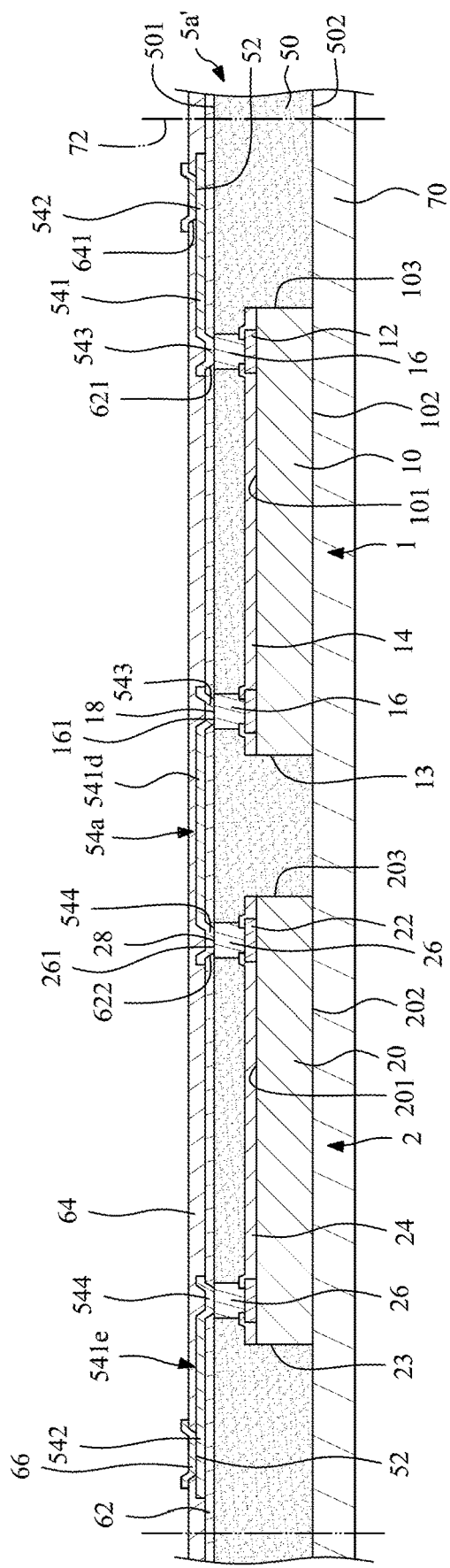
FIG. 16 illustrates one or more stages of an example of a method for manufacturing a semiconductor package structure according to some embodiments of the present disclosure.

Referring to FIG. 16, a plurality of UBMs 66 may be formed or disposed in the openings 641 and on the exposed portions of the conductive pads 544. Thus, the bottom surfaces of the UBMs 66 may be also referred to as the second electrical contacts 52.

Figure 17:
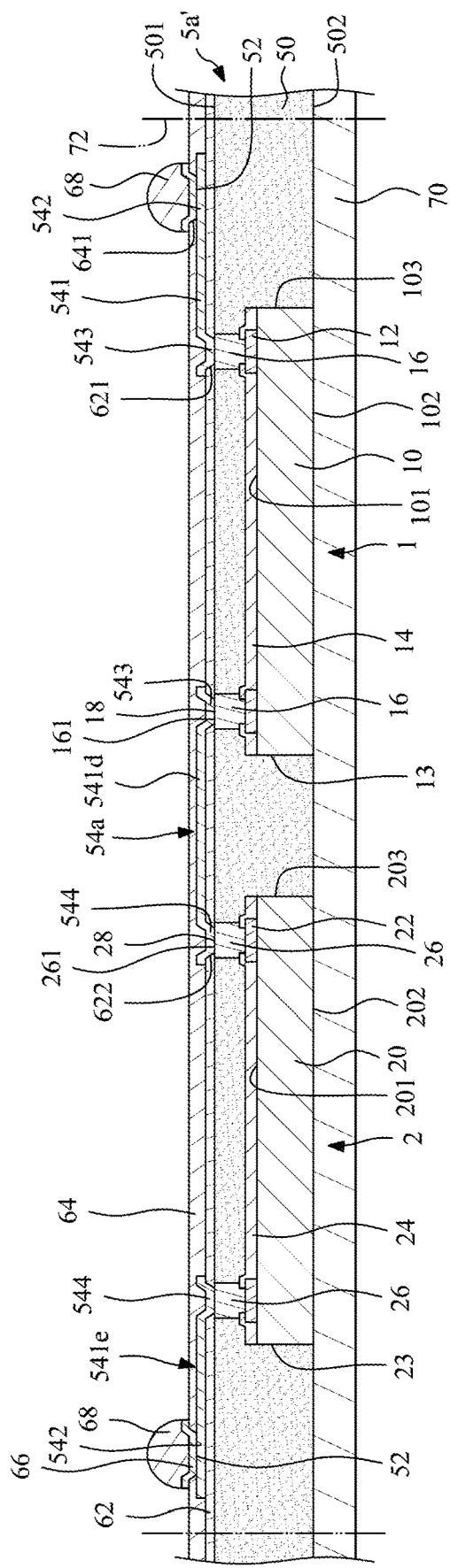
FIG. 17 illustrates one or more stages of an example of a method for manufacturing a semiconductor package structure according to some embodiments of the present disclosure.

Referring to FIG. 17, a plurality of external connectors 68 may be formed or disposed on the UBMs 66. Then, the carrier 70 is removed. Then, a singulation process is conducted along the cutting lines 72 so as to obtain the semiconductor package structure 6a shown in FIG. 4 and FIG. 5.

Figure 18:
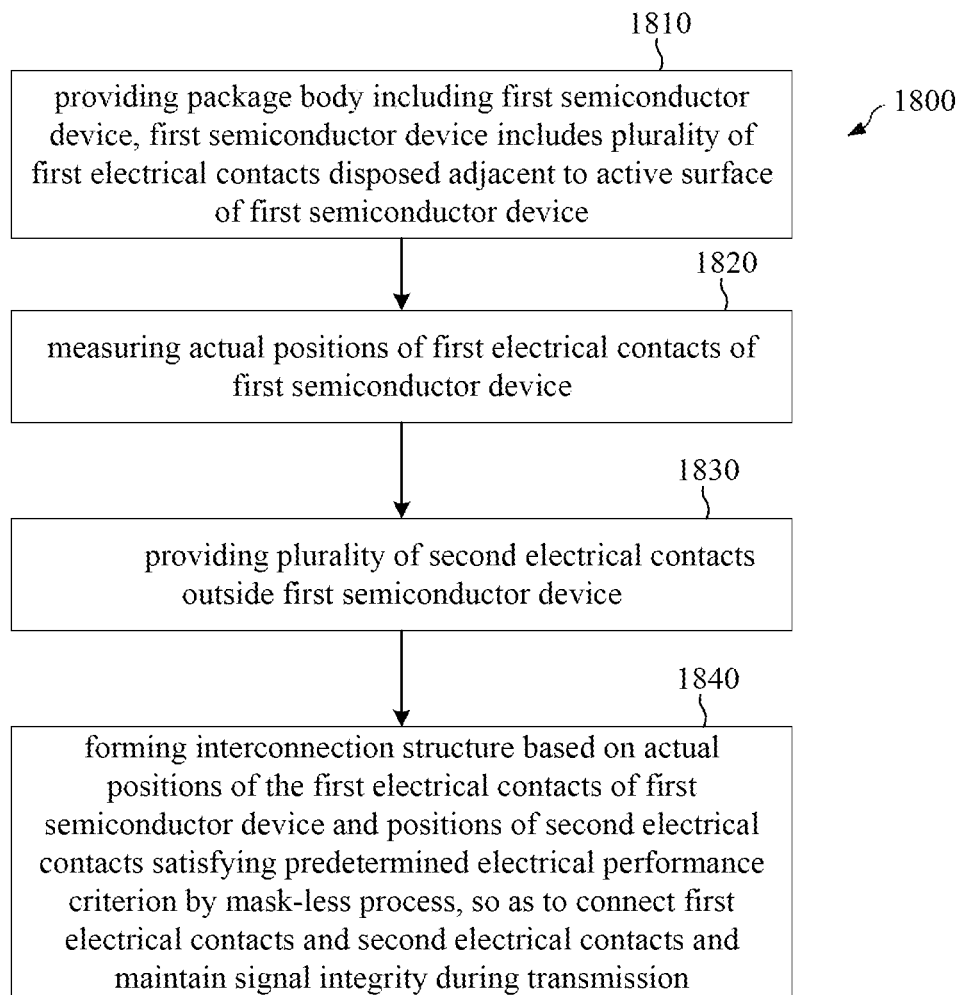
FIG. 18 is a flowchart diagram illustrating an example method for manufacturing a semiconductor package structure according to some embodiments of the present disclosure.

FIG. 18 is a flowchart diagram illustrating an example method 1800 for manufacturing a semiconductor package structure according to some embodiments of the present disclosure. Referring to FIGS. 1-18, at 1810, a package body that includes a first semiconductor device is provided. The first semiconductor device includes a plurality of first electrical contacts disposed adjacent to an active surface of the first semiconductor device. In some examples, providing the package body includes disposing the first semiconductor device on a carrier and encapsulating the first semiconductor device with an encapsulant to form the package body. In some examples, the package body further includes a second semiconductor device encapsulated by the encapsulant. The second semiconductor device includes the second electrical contacts disposed adjacent to an active surface thereof In some embodiment, after 1810, the method 1800 further includes generating a pre-routing layout pattern including a predetermined interconnection structure based on a plurality of first predetermined positions of the first electrical contacts of the first semiconductor device and a plurality of second predetermined positions of the second electrical contacts satisfying the predetermined electrical performance criterion. In some examples, the predetermined interconnection structure is not generated to satisfy the predetermined electrical performance criterion, and the method 1800 further includes adjusting the simulated traces of the predetermined interconnection structure.

At 1820, actual positions of the first electrical contacts of the first semiconductor device are measured. The actual positions of the second electrical contacts of the second semiconductor device are further measured.

At 1830, a plurality of second electrical contacts is provided outside the first semiconductor device. The interconnection structure is formed based on the actual positions of the first electrical contacts and the actual positions of the second electrical contacts satisfying the predetermined electrical performance criterion.

In some embodiments, after block 1830, the method 1800 further includes generating a simulated interconnection structure based on the actual positions of the first electrical contacts of the first semiconductor device and the positions of the second electrical contacts, and adjusting some simulated traces of the simulated interconnection structure that do not satisfy the predetermined electrical performance criterion to ensure all simulated traces of the simulated interconnection structure satisfy the predetermined electrical performance. The interconnection structure is formed according to the simulated interconnection structure.

In some embodiments, after block 1830, the method 1800 further includes generating a simulated interconnection structure based on the actual positions of the first electrical contacts of the first semiconductor device and the positions of the second electrical contacts on a first circuit layer satisfying the predetermined electrical performance criterion. The simulated interconnection structure is not generated in the first circuit layer, and the method 1800 further includes generating a second circuit layer on the first circuit layer satisfying the predetermined electrical performance criterion.

In some embodiments, after block 1830, the method 1800 further includes generating at least one fixed portion of a simulated interconnection structure based on the actual positions of the first electrical contacts of the first semiconductor device and the positions of the second electrical contacts satisfying the predetermined electrical performance criterion; and generating at least one adjustable portion of the simulated interconnection structure based on the actual positions of the first electrical contacts of the first semiconductor device and the positions of the second electrical contacts satisfying the predetermined electrical performance criterion. The simulated traces in the adjustable portion are adjustable.

At 1840, an interconnection structure is formed based on the actual positions of the first electrical contacts of the first semiconductor device and positions of the second electrical contacts satisfying a predetermined electrical performance criterion by a mask-less process, so as to connect the first electrical contacts and the second electrical contacts and to maintain signal integrity during transmission.

In some embodiments, forming the interconnection structure at 1840 includes forming a plurality of conductive traces satisfying the predetermined electrical performance criterion, so that signals transmitted in the conductive traces do not interfere with each other based on generated noise. In some examples, the two adjacent conductive traces is a differential pair. In some examples, a minimum space between two adjacent conductive traces is greater than a width of the conductive trace. Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to +10% of that numerical value, such as less than or equal to +5%, less than or equal to +4%, less than or equal to +3%, less than or equal to +2%, less than or equal to #1%, less than or equal to +0.5%, less than or equal to +0.1%, or less than or equal to +0.05%. For example, a first numerical value can be deemed to be "substantially" the same or equal to a second numerical value if the first numerical value is within a range of variation of less than or equal to +10% of the second numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, "substantially" perpendicular can refer to a range of angular variation relative to 90° that is less than or equal to +10°, such as less than or equal to +5°, less than or equal to +4°, less than or equal to +3°, less than or equal to +2°, less than or equal to +1°, less than or equal to +0.5°, less than or equal to +0.1°, or less than or equal to +0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
   a plurality of first electrical contacts, wherein a first imaginary line extends through a row of the plurality of first electrical contacts;
   a plurality of second electrical contacts disposed outside the first imaginary line, wherein a second imaginary line extends through a row of the plurality of second electrical contacts, and the first imaginary line is non-parallel with the second imaginary line in a top view; and
   an interconnection structure connecting the plurality of first electrical contacts and the plurality of second electrical contacts, wherein in a cross section view, the plurality of first electrical contacts laterally overlap the plurality of second electrical contacts, wherein the interconnection structure includes a trace including two segments intersecting with each other at an intersection angle.

2. The package structure of claim 1, wherein the first imaginary line is non-perpendicular to the second imaginary line.

3. The package structure of claim 2, wherein the plurality of first electrical contacts and the plurality of second electrical contacts are encapsulated in an encapsulant.

4. The package structure of claim 3, wherein the plurality of first electrical contacts are disposed on a first device.

5. The package structure of claim 4, wherein the second device is disposed side by side with the first device, wherein the plurality of second electrical contacts are disposed on the second device.

6. The package structure of claim 1, wherein the intersection angle is greater than 90 degrees.

7. A package structure, comprising:
   a first device including a first electrical contact;
   a second device including a second electrical contact;
   an encapsulant encapsulating the first device and the second device, and having a surface substantially aligned with a surface of the first electrical contact and a surface of the second electrical contact;
   a conductive trace electrically connecting the first electrical contact and the second electrical contact, disposed over the encapsulant, and vertically overlapping a gap between the first device and the second device; and
   a conductive via disposed over the first electrical contact and tapering toward the first electrical contact.

8. The package structure of claim 7, wherein the first device includes a lateral surface facing a lateral surface of the second device, wherein the lateral surface of the first device is non-parallel with the lateral surface of the second device.

9. The package structure of claim 7, wherein an extending direction of the conductive trace is oblique to a lateral surface of the first device.

10. The package structure of claim 7, wherein a width of a top end of the conductive via is less than a width of the first electrical contact.

* * * * *